(12) United States Patent
Jung et al.

(10) Patent No.: US 8,125,086 B2
(45) Date of Patent: Feb. 28, 2012

(54) SUBSTRATE FOR SEMICONDUCTOR PACKAGE

(75) Inventors: Young Berm Jung, Chungcheongbuk-do (KR); Hong Bum Park, Seoul (KR); Young Geon Kwon, Chungcheongbuk-do (KR); Seong Kwon Chin, Gyeonggi-do (KR); Byeung Ho Kim, Chungcheongbuk-do (KR); Seok Koo Jung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 280 days.

(21) Appl. No.: 12/471,572

(22) Filed: May 26, 2009

(65) Prior Publication Data

US 2009/0294972 A1 Dec. 3, 2009

(30) Foreign Application Priority Data

May 28, 2008 (KR) .......................... 10-2008-0049881
May 7, 2009 (KR) .......................... 10-2009-0039717

(51) Int. Cl.
*H01L 23/48* (2006.01)
*H01L 23/52* (2006.01)
*H01L 29/40* (2006.01)

(52) U.S. Cl. ........ 257/762; 257/764; 257/774; 438/118; 438/121

(58) Field of Classification Search ................... 257/762, 257/764, E21.499, E23.06; 438/118, 612, 438/613, 614
See application file for complete search history.

(56) References Cited

U.S. PATENT DOCUMENTS

| | | | | |
|---|---|---|---|---|
| 6,396,153 B2* | 5/2002 | Fillion et al. | ................... | 257/774 |
| 6,515,361 B2* | 2/2003 | Lee et al. | ................... | 257/738 |
| 2006/0145322 A1* | 7/2006 | Takahashi et al. | ................... | 257/678 |
| 2008/0083115 A1* | 4/2008 | Hsu et al. | ................... | 29/842 |
| 2008/0315239 A1* | 12/2008 | Lin et al. | ................... | 257/99 |
| 2009/0008135 A1* | 1/2009 | Fan | ................... | 174/255 |

FOREIGN PATENT DOCUMENTS

| | | |
|---|---|---|
| JP | 2003-046055 A | 2/2003 |
| JP | 2004-014568 A | 1/2004 |
| JP | 2005-051012 A | 2/2005 |
| KR | 1999-001864 U | 1/1999 |
| KR | 1020070025624 A | 3/2007 |

* cited by examiner

*Primary Examiner* — Phuc Dang
(74) *Attorney, Agent, or Firm* — Ladas & Parry LLP

(57) ABSTRACT

A method for manufacturing a substrate for a semiconductor package includes the steps of attaching first and second insulation layers which have first surfaces and second surfaces and are formed with conductive layers on the first surfaces, by the medium of a release film which has adhesives attached to both surfaces thereof, such that the second surfaces of the first and second insulation layers face each other; forming first conductive patterns on the first surfaces of the first and second insulation layers by patterning the conductive layers; forming solder masks on the first surfaces of the first and second insulation layers including the first conductive patterns to open portions of the first conductive patterns; and separating the first and second insulation layers from each other by removing the release film.

7 Claims, 20 Drawing Sheets

SUBSTRATE FOR SEMICONDUCTOR PACKAGE

CROSS-REFERENCE TO RELATED APPLICATIONS

The present application claims priority to Korean patent application numbers 10-2008-0049881 filed on May 28, 2008 and 10-2009-0039717 filed on May 7, 2009, which are incorporated herein by reference in their entireties.

BACKGROUND OF THE INVENTION

The present invention relates generally to a semiconductor package, and more particularly, to a substrate for a semiconductor package, a method for manufacturing the same, and a semiconductor package having the same, which requires fewer processing steps during the manufacturing process of a substrate and can prevent the delamination of an encapsulant.

In the semiconductor industry, the constant demand for miniaturization and mounting reliability has driven the development of packaging technology for integrated circuits. For example, the demand for miniaturization has accelerated package development to the extent that the size of semiconductor packages is approaching the size of a semiconductor chip itself; and further, the demand for mounting reliability has accelerated the development of techniques for improving the efficiency of a mounting task and mechanical and electrical reliability after mounting.

An exemplary package, which can accomplish miniaturization of a package, is a BGA (ball grid array) package. In the BGA package, the size of the entire package is very close to that of the size of a semiconductor chip. Further, the BGA package utilizes solder balls as a means for making electrical connection with external circuits (for example, as mounting means to a printed circuit board), which further accommodates the trend toward decrease in a mounting area.

Recently, the FBGA (fine pitch ball grid array) package has been mentioned. The FBGA package provides advantages in that the fine pitch of signal and power input and output pins can be accomplished in conformance with the high integration of semiconductor chips, and electrical connections with external circuits are formed by solder balls in such a way as to reduce the mounting area and shorten a signal transmission path.

A substrate used to form the BGA package, including the FBGA package, comprises an insulation layer, conductive patterns formed on one surface or both surfaces of the insulation layer to form electrical connections with a semiconductor chip and external circuits, and solder masks formed on surfaces of the insulation layer to protect the conductive patterns.

Referring to FIG. 1A, in a case where conductive patterns are formed on only one surface of the insulation layer, the substrate is manufactured by a first step (ST1) of attaching a mask film to a conductive layer, which is formed on one surface of the insulation layer, through a twelfth step (ST12) of cutting a strip level substrate into a unit level.

Referring to FIG. 1B, in a case where the conductive patterns are formed on both surfaces of the insulation layer, the substrate is manufactured by a first step (ST1) of defining via holes through the insulation layer, which has conductive layers formed on both surfaces thereof, through a sixteenth step (ST16) of cutting a strip level substrate into a unit level.

As illustrated in FIGS. 1A-1B, the conventional substrate used when manufacturing a BGA package (including the FBGA package) is formed through a number of manufacturing processes, thereby causing a decrease in productivity and an increase in the manufacturing cost.

Moreover, because a solder mask is formed on the surface of the substrate to which the semiconductor chip is to be attached, the thickness of the package increases. Also, when conducting a molding process for completing the manufacture of a semiconductor package, a phenomenon in which an encapsulant such as an EMC (epoxy molding compound) is delaminated, occurs frequently due to contamination of the surface of the solder mask.

When manufacturing the BGA type semiconductor package, it is the norm that, after applying an adhesive on the substrate, a series of processes are conducted to semi-cure the adhesive, attach the semiconductor chip to the semi-cured adhesive and then completely cure the semi-cured adhesive for the complete attachment of the semiconductor chip. In this regard, since the process for applying the adhesive should be separately conducted, there is an additional decline in productivity and increase in the manufacturing cost. Also, contamination can be caused due to streaming of the adhesive while applying the adhesive; and in this case, a cleaning process should be additionally conducted, causing a further reduction in productivity and the quality of the semiconductor package.

BRIEF SUMMARY OF THE INVENTION

Embodiments of the present invention include a substrate for a semiconductor package and a method for manufacturing the same that requires fewer process steps when manufacturing a substrate, thereby improving productivity and reducing manufacturing cost.

Also, embodiments of the present invention include a substrate for a semiconductor package and a method for manufacturing the same, which can prevent delamination of an encapsulant while manufacturing a semiconductor package.

Further, embodiments of the present invention include a substrate for a semiconductor package and a method for manufacturing the same, which can improve the quality of a semiconductor package by preventing degradation due to delamination of an encapsulant and the streaming of an adhesive in the course of manufacturing a semiconductor package.

In addition, embodiments of the present invention include a semiconductor package having the substrate.

In one aspect of the present invention, a substrate for a semiconductor package comprises an insulation layer having a first surface and a second surface which faces away from the first surface; first conductive patterns formed on the first surface of the insulation layer; a solder mask formed selectively on the first surface of the insulation layer including the first conductive patterns in such a way as to open portions of the first conductive patterns; and an adhesive attached to the second surface of the insulation layer.

The substrate further comprises a metal layer plated on the portions of the first conductive patterns which are open through the solder mask.

The first conductive patterns are formed of copper, and the metal layer comprises a stack layer of Ni and Au.

The insulation layer is defined with a cavity at a center portion thereof.

The substrate further comprises via patterns formed in the insulation layer to be connected with the first conductive patterns which are formed on the first surface of the insulation layer; and second conductive patterns formed on the second surface of the insulation layer to be connected with the via patterns.

In another aspect of the present invention, a method for manufacturing a substrate for a semiconductor package comprises the steps of attaching a first insulation layer and a second insulation layer which have first surfaces and second surfaces facing away from the first surfaces and are formed with conductive layers on the first surfaces thereof, by the medium of a release film which has adhesives attached to both surfaces thereof, such that the second surfaces of the first and second insulation layers face each other; forming first conductive patterns on the first surfaces of the first and second insulation layers by patterning the conductive layers; forming solder masks on the first surfaces of the first and second insulation layers including the first conductive patterns in such a way as to open portions of the first conductive patterns; and separating the first and second insulation layers from each other by removing the release film, with the first conductive patterns and the solder masks formed on the first surfaces of the first and second insulation layers and the adhesives attached to the second surfaces of the first and second insulation layers.

After the step of forming the solder masks and before the step of separating the first and second insulation layers from each other, the method further comprises the step of forming metal layers on the portions of the first conductive patterns which are open through the solder masks.

The first conductive patterns are formed of copper, and each of the metal layers comprises a stack layer of Ni and Au.

After the step of forming the metal layers, the method further comprises the step of defining cavities through center portions of the first and second insulation layers.

After the step of separating the first and second insulation layers from each other, the method further comprises the steps of forming via patterns in the first and second insulation layers to be connected with the first conductive patterns which are formed on the first surfaces of the first and second insulation layers; and forming second conductive patterns on the second surfaces of the first and second insulation layers to be connected with the via patterns.

In another aspect of the present invention, a method for manufacturing a substrate for a semiconductor package comprises the steps of attaching a first insulation layer and a second insulation layer which have first surfaces and second surfaces facing away from the first surfaces, by the medium of a release film which has adhesives attached to both surfaces thereof, such that the second surfaces of the first and second insulation layers face each other; forming conductive layers on the first surfaces of the first and second insulation layers which are open; forming first conductive patterns on the first surfaces of the first and second insulation layers by patterning the conductive layers; forming solder masks on the first surfaces of the first and second insulation layers including the first conductive patterns in such a way as to open portions of the first conductive patterns; and separating the first and second insulation layers from each other by removing the release film, with the first conductive patterns and the solder masks formed on the first surfaces thereof and the adhesives attached to the second surfaces thereof.

After the step of forming the solder masks and before the step of separating the first and second insulation layers from each other, the method further comprises the step of forming metal layers on the portions of the first conductive patterns which are open through the solder masks.

The first conductive patterns are formed of copper, and each of the metal layers comprises a stack layer of Ni and Au.

After the step of forming the metal layers, the method further comprises the step of defining cavities through center portions of the first and second insulation layers.

After the step of separating the first and second insulation layers from each other, the method further comprises the steps of forming via patterns in the first and second insulation layers to be connected with the first conductive patterns which are formed on the first surfaces of the first and second insulation layers; and forming second conductive patterns on the second surfaces of the first and second insulation layers to be connected with the via patterns.

In another aspect of the present invention, a method for manufacturing a substrate for a semiconductor package comprises the steps of forming conductive layers on both surfaces of an insulation layer; forming first conductive patterns on both surfaces of the insulation layer by patterning the conductive layers; forming solder masks on both surfaces of the insulation layer on which the first conductive patterns are formed, in such a way as to open portions of the first conductive patterns; dividing the insulation layer which has the solder masks formed on both surfaces thereof, into a first insulation layer and a second insulation layer which have the first conductive patterns and the solder masks formed on only first surfaces thereof; and attaching adhesives to second surfaces of the first and second insulation layers which face away from the first surfaces.

After the step of forming the solder masks and before the step of dividing the insulation layer into the first and second insulation layers, the method further comprises the step of forming metal layers on the portions of the first conductive patterns which are open through the solder masks.

The first conductive patterns are formed of copper, and each of the metal layers comprises a stack layer of Ni and Au.

After the step of forming the metal layers, the method further comprises the step of defining a cavity through a center portion of the insulation layer.

After the step of dividing the insulation layer into the first and second insulation layers and before the step of attaching the adhesives to the second surfaces of the first and second insulation layers, the method further comprises the steps of forming via patterns in the first and second insulation layers to be connected with the first conductive patterns which are formed on the first surfaces of the first and second insulation layers; and forming second conductive patterns on the second surfaces of the first and second insulation layers to be connected with the via patterns.

In still another aspect of the present invention, a semiconductor package comprises a substrate having an insulation layer which has a first surface and a second surface facing away from the first surface and is defined with a cavity at a center portion thereof, conductive patterns which are formed on the first surface of the insulation layer, a solder mask which is formed on the first surface of the insulation layer including the conductive patterns in such a way as to open portions of the conductive patterns, and an adhesive which is attached to the second surface of the insulation layer; a semiconductor chip attached to the second surface of the substrate in a face-down type by the adhesive; and electrical connection means connecting the semiconductor chip and the conductive patterns of the substrate.

The semiconductor package further comprises a metal layer formed on the portions of the conductive patterns which are open through the solder mask.

The first conductive patterns are formed of copper, and the metal layer comprises a stack layer of Ni and Au.

The electrical connection means connect the semiconductor chip with the conductive patterns of the substrate through the cavity of the insulation layer.

The electrical connection means comprise metal wires.

The semiconductor package further comprises an encapsulant sealing the second surface of the substrate including the semiconductor chip and the electrical connection means; and external connection means attached to the conductive patterns of the substrate.

In a still further aspect of the present invention, a semiconductor package comprises a substrate having an insulation layer which has a first surface and a second surface facing away from the first surface, first conductive patterns which are formed on the first surface of the insulation layer, via patterns which are formed in the insulation layer to be connected with the first conductive patterns, second conductive patterns which are formed on the second surface of the insulation layer to be connected with the via patterns, a solder mask which is formed on the first surface of the insulation layer including the first conductive patterns in such a way as to open portions of the first conductive patterns, and an adhesive which is attached to the second surface of the insulation layer; a semiconductor chip attached to the second surface of the substrate in a face-up type by the adhesive; and electrical connection means connecting the semiconductor chip and the first conductive patterns of the substrate.

The semiconductor package further comprises a metal layer formed on the portions of the first conductive patterns which are open through the solder mask.

The first conductive patterns are formed of copper, and the metal layer comprises a stack layer of Ni and Au.

The electrical connection means comprise metal wires.

The semiconductor package further comprises an encapsulant sealing the second surface of the substrate including the semiconductor chip and the electrical connection means; and external connection means attached to the first conductive patterns of the substrate.

DESCRIPTION OF SPECIFIC EMBODIMENTS

Hereafter, specific embodiments of the present invention will be described in detail with reference to the accompanying drawings. It is understood herein that the drawings are not necessarily to scale and in some instances proportions may have been exaggerated in order to more clearly depict certain features of the invention.

Figure 2:
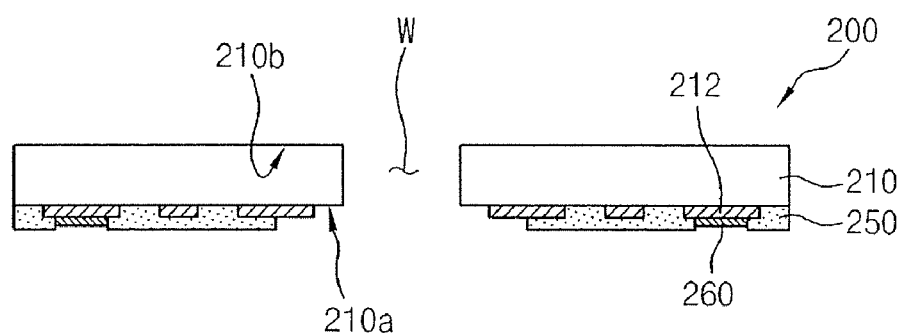
FIG. 2 is a cross-sectional view showing a substrate for a semiconductor package in accordance with a first embodiment of the present invention.

FIG. 2 is a cross-sectional view showing a substrate for a semiconductor package in accordance with a first embodiment of the present invention.

Referring to FIG. 2, a substrate 200 for a semiconductor package in accordance with an embodiment of the present invention includes an insulation layer 210 having a first surface 210a and a second surface 210b facing away from the first surface 210a. Conductive patterns 212 are formed on the first surface 210a of the insulation layer 210. A solder mask 250 is formed on the first surface 210a of the insulation layer 210 including on the conductive patterns 212 while having openings that expose portions of the conductive patterns 212 that are to be electrically connected to metal wires or external connection terminals. A metal layer 260 is formed on the portions of the conductive patterns 212 that are exposed by the openings in the solder mask 250 to allow for easy formation of electrical connections to the metal wires or external connection terminals.

A cavity W is defined at the center portion of the insulation layer 210 so that electrical connections between a semiconductor chip and the conductive patterns 212 can be easily formed through the cavity W. Electrical connection through the cavity takes place, for example, in a case where a center pad type semiconductor chip is attached face down to the second surface 210b of the insulation layer 210 when manufacturing a semiconductor package.

A solder mask is not formed on the second surface 210b of the insulation layer 210, that is, the surface of the insulation layer 210 to which a semiconductor chip is to be attached, when manufacturing a semiconductor package.

Figure 3:
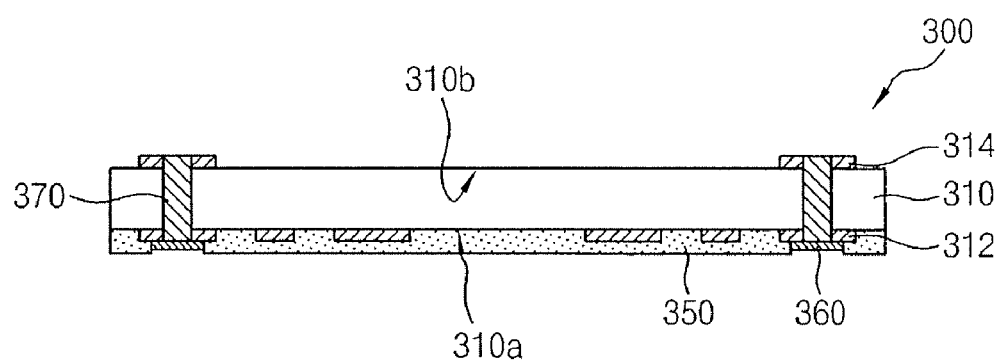
FIG. 3 is a cross-sectional view showing a substrate for a semiconductor package in accordance with a second embodiment of the present invention.

FIG. 3 is a cross-sectional view showing a substrate for a semiconductor package in accordance with a second embodiment of the present invention.

Referring to FIG. 3, in a substrate 300 for a semiconductor package in accordance with an embodiment of the present invention, when compared to the substrate 200 for a semiconductor package in accordance with the first embodiment of the present invention, via patterns 370 are additionally formed in an insulation layer 310 in such a way as to be connected to first conductive patterns 312 which are formed on a first surface 310a of the insulation layer 310. Further, second conductive patterns 314 are formed on a second surface 310b of the insulation layer 310 in such a way as to be connected to the via patterns 370.

Accordingly, the substrate 300 for a semiconductor package in accordance with the second embodiment of the present invention has a structure in which not only the first conductive patterns 312 are formed on the first surface 310a of the insulation layer 310, but also the second conductive patterns 314 are formed on the second surface 310b of the insulation layer 310 to be connected to the first conductive patterns 312 through the via patterns 370.

The second conductive patterns 314 and the via patterns 370 can be understood as being additionally formed to allow electrical connections to be easily formed between a semiconductor chip and the first conductive patterns 312 in a case where a semiconductor chip is attached face-up or is flip-chip bonded to the second surface 310b of the insulation layer 310 when manufacturing a semiconductor package. Accordingly, in the substrate 300 for a semiconductor package in accordance with the second embodiment of the present invention, a cavity is not defined in the center portion of the insulation layer 310.

In the substrate 300 for a semiconductor package in accordance with the second embodiment of the present invention, in the same manner as in the substrate 200 for a semiconductor package according to the first embodiment, a solder mask 350 is formed on only the first surface 310a of the insulation layer 310 on which the first conductive patterns 312 are formed. The solder mask 350 is formed with openings so that the first conductive patterns 312 are exposed through the openings. No solder mask is formed on the second surface 310b of the insulation layer 310 to which the semiconductor chip is to be attached. A metal layer 360 comprising a stack layer of Ni and Au is formed on the portions of the first conductive patterns 312 that are exposed by the opening in the solder mask 350.

Figure 4:
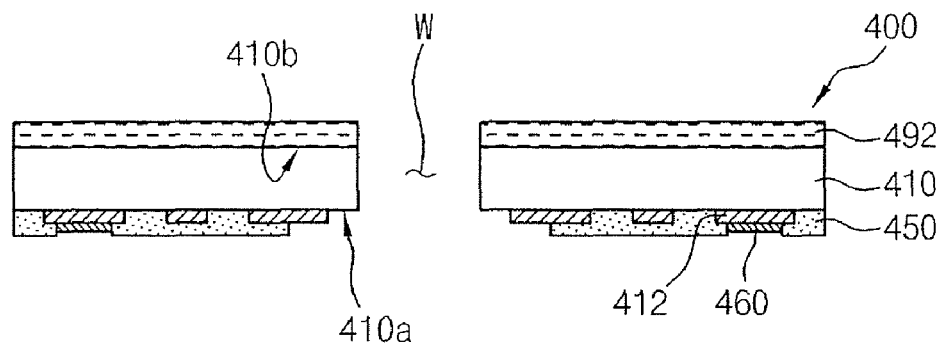
FIGS. 4 and 5 are cross-sectional views showing substrates for a semiconductor package in accordance with third and fourth embodiments of the present invention.
Figure 5:
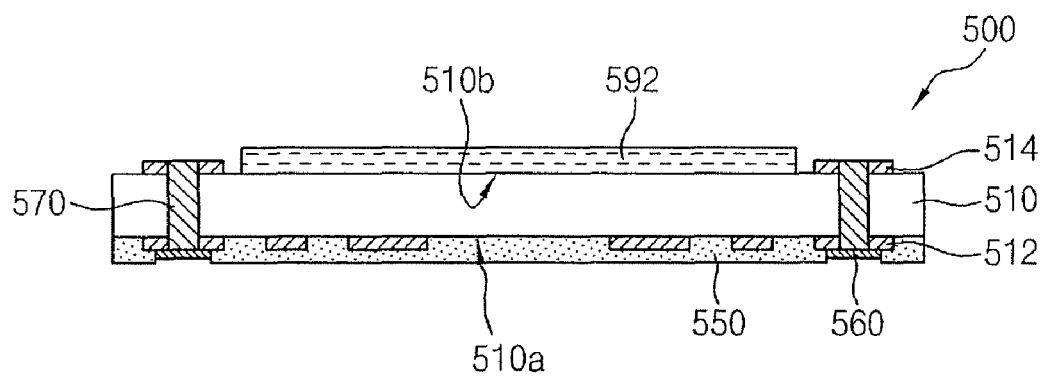

FIGS. 4 and 5 are cross-sectional views showing substrates for a semiconductor package in accordance with third and fourth embodiments of the present invention.

Referring to FIGS. 4 and 5, substrates 400 and 500 for a semiconductor package in accordance with third and fourth embodiments of the present invention have respective structures in which adhesives 492 and 592 are attached to second surfaces 410b and 510b of insulation layers 410 and 510. The adhesives 492 and 592 are attached in advance to the second surface 410b and 510b of the insulation layers 410 and 510 so as to prevent productivity from deteriorating, the increased manufacturing cost and contamination caused by streaming of an adhesive caused when the processes for applying and curing an adhesive for attaching a semiconductor chip are conducted when manufacturing a semiconductor package.

In the embodiments of the present invention shown in FIGS. 4 and 5, first conductive patterns 412 and 512 are formed on first surfaces 410a and 510a of the insulation layer 410 and 510. Also, solder masks 450 and 550 are formed on only the first surfaces 410a and 510a of the insulation layer 410 and 510 including the first conductive patterns 412 and 512, and the solder masks 450 and 450 are formed with openings that expose portions of the first conductive patterns 412 and 512. Metal layers 460 and 560 each comprising the stack layer of Ni and Au are formed on the exposed portions of the first conductive patterns 412 and 512 in the openings to facilitate electrical connections to metal wires or external connection terminals.

Referring to the substrate 400 for a semiconductor package shown in FIG. 4, in order to ensure that electrical connections are easily formed between a semiconductor chip and the first conductive patterns 412 when manufacturing a semiconductor package, a cavity W is defined through the center portion of the insulation layer 410. As shown in FIG. 4, the adhesive 492 is formed such that it covers the second surface 410b but not the inner surface of the cavity W within the insulation layer 410.

Referring to the substrate 500 for a semiconductor package shown in FIG. 5, via patterns 570 are formed in the insulation layer 510 and extend through the insulation layer so as to be connected to the first conductive patterns 512 and second conductive patterns 514 formed on the second surface 510b of the insulation layer 510. As shown in FIG. 5, the adhesive 592 is formed on the second surface of the insulation layer so as to not cover or contact the second conductive patterns 514.

Figure 6A:
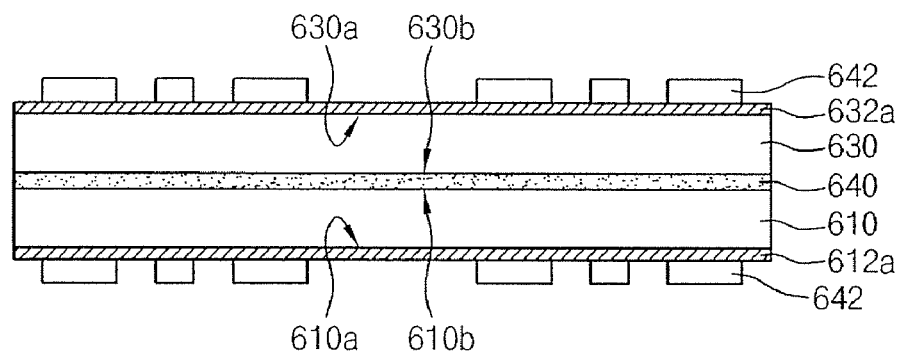
FIGS. 6A through 6D and FIG. 7 are cross-sectional views and a flow chart shown for illustrating and explaining the processes of a method for manufacturing a substrate for a semiconductor package in accordance with a fifth embodiment of the present invention.
Figure 6B:
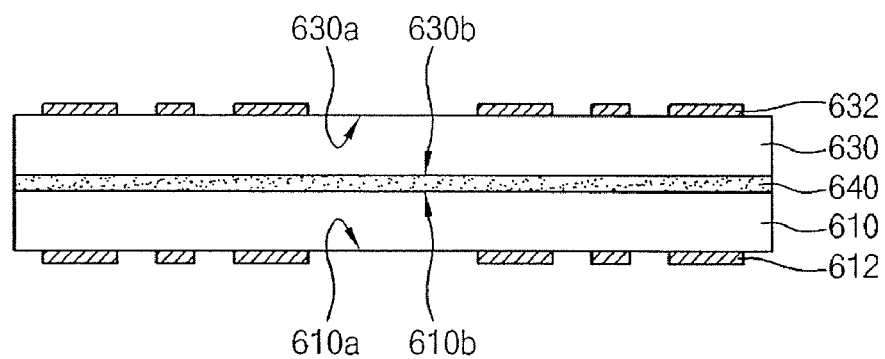
Figure 6C:
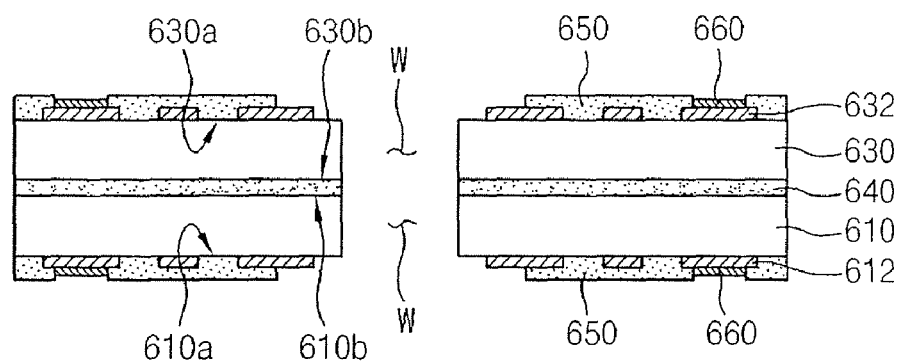
Figure 6D:
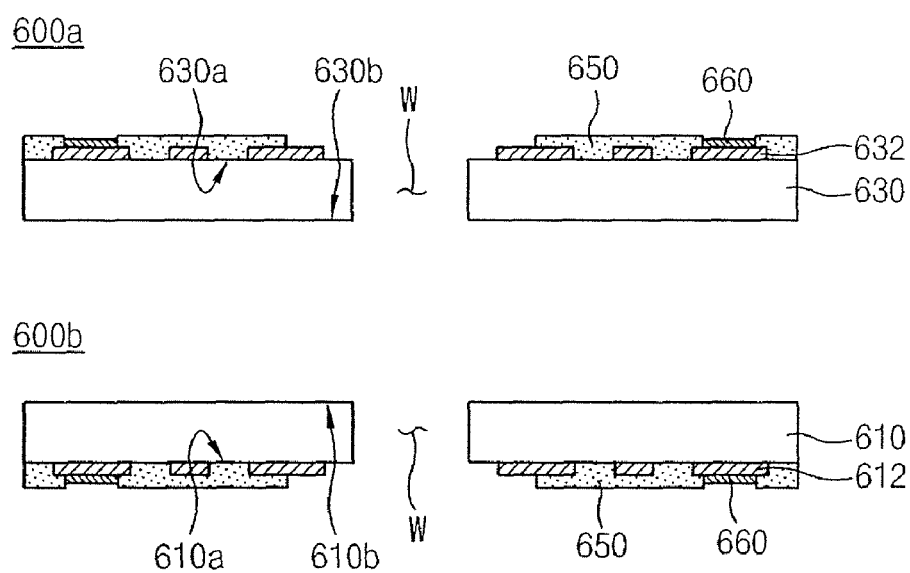
Figure 7:
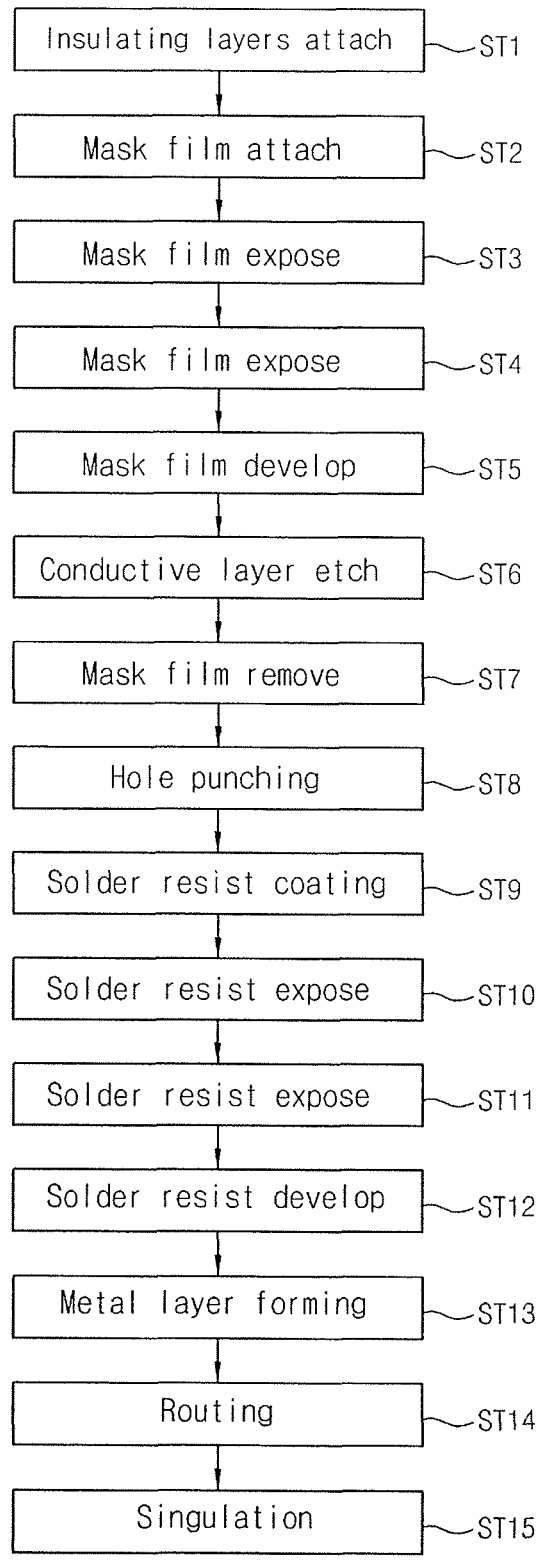

FIGS. 6A through 6D and FIG. 7 are cross-sectional views and a flow chart shown for illustrating and explaining the processes of a method for manufacturing a substrate for a semiconductor package in accordance with a fifth embodiment of the present invention. The method will be described below. FIG. 7 will be referenced while describing FIGS. 6A through 6D.

Figure 8:
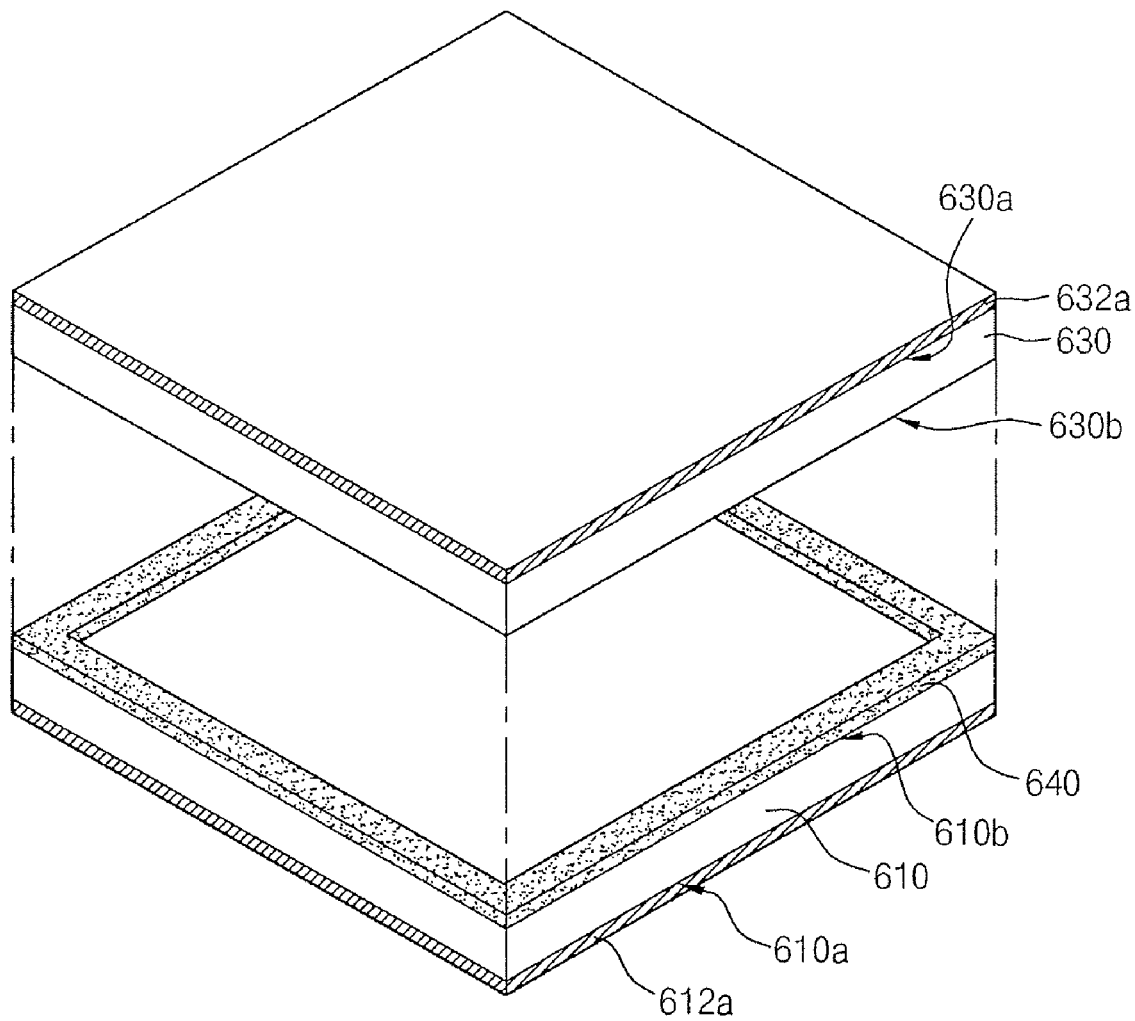
FIG. 8 is an exploded perspective view showing the application of an adhesive in the method for manufacturing a substrate for a semiconductor package in accordance with the fifth embodiment of the present invention shown with respect to FIGS. 6A through 6D and FIG. 7.

Referring to FIG. 6A, a first insulation layer 610 and a second insulation layer 630 having first surfaces 610a and 630a and second surfaces 610b and 630b, respectively, are provided. The second surfaces 610b and 630b face away from the first surfaces 610a and 630b of their respective first and second insulation layers 610 and 630. Conductive layers 612a and 632a are formed on the first surfaces 610a and 630a, respectively. The first and second insulation layers 510 and 630 are prepared and positioned so as to be attached to each other in a manner in which the second surfaces 610b and 630b face each other (ST1). The attachment of the first insulation layer 610 to the second insulation layer 630 is facilitated by the medium of an adhesive 640 which is applied as an adhesive member to any one of the first insulation layer 610 and the second insulation layer 630. In an embodiment, the insulation layer 630 is formed, for example, on the peripheral portions of the second surface 610b of the first insulation layer 610, as shown in FIG. 8. That is, the insulation layer is formed, for example, on the second surface 610b and/or 630b of the first and/or second insulation layer 610 and/or 630 at the outermost edge of the second surface 610b and/or 630b so as to be formed around the perimeter of the second surface 610b and/or 630b and leave exposed a central region of the second surface 610b and/or 630b. It is preferred that the adhesive 640 be applied to portions of the first and/or second insulation layers 610 and/or 630 which are to be removed during a subsequent routing process.

Mask patterns 642 used in the process of patterning the conductive layers 612a and 632a are formed on the conductive layers 612a and 632a. In an embodiment, the mask patterns 642 are formed by attaching mask films (ST2), exposing the mask film formed on the first surface 610a of the first insulation layer 610 (ST3), exposing the mask film formed on the first surface 630a of the second insulation layer 630 (ST4), and developing the exposed mask films (ST5) so as to selectively remove portions of the mask film and form the mask patterns 642 which selectively expose portions of the conductive layers 612a and 632a. Photoresist films can be employed in place of the mask films.

Referring to FIG. 6B, the exposed (i.e., open) portions of the conductive layers 612a and 632a are etched using the mask patterns 642 as etch masks (ST6). Through this, conductive patterns 612 and 632 are selectively formed on the first surfaces 610a and 630a of the first and second insulation layers 610 and 630. Then, the mask patterns 642 used as etch masks are removed (ST7).

Referring to FIG. 6C, a hole punching process is conducted for the resultant structure (ST8). The hole punching process is the process for forming a plurality of holes at regular intervals in the outside part of the substrate region where the semiconductor chips is attached in order to make easily move of which the substrate is normally manufactured at a strip level. Next, after applying solder resist to the first surfaces 610a and 630a of the first and second insulation layers 610 and 630 including the conductive patterns 612 and 632 (ST9), the solder resist applied to the first surface 610a of the first insulation layer 610 is exposed (ST10), and sequentially, the solder resist applied to the first surface 630a of the second insulation layer 630 is exposed (ST11). Thereupon, the exposed solder resist is developed (ST12), as a result of which solder masks 650 are formed on the first surfaces 610a and 630a of the first and second insulation layers 610 and 630 in such a way as to have openings that leave exposed (i.e., open) portions of the conductive patterns 612 and 632. The open portions of the conductive patterns 612 and 632 can be understood as portions to which metal wires or external connection terminals are to be attached when manufacturing a semiconductor package.

Metal layers 660 are formed on the open portions of the conductive patterns 612 and 632 (ST13). The metal layers 660 act to prevent the open portions of the conductive patterns 612 and 632, which are open to external conditions, from being corroded and allow electrical connections to be easily formed between the conductive patterns 612 and 632 and the metal wires or external connection terminals. Preferably, each of the metal layers 660 is formed as a stack layer comprising Ni and Au through a plating process.

Cavities W are defined through the center portions of the first and second insulation layers 610 and 630. As shown in FIG. 6C, the cavities W extend through the first and second insulation layers 610 and 630 including the adhesive 640 which facilitates the attachment of the first and second insulation layer 610 and 630. For example, the cavities W can be understood as being defined to allow electrical connections to be easily formed between semiconductor chips and the conductive patterns 612 and 632 in a case in which semiconductor chips of a center pad type are attached face down (i.e., in a face-down type) to the second surfaces 610b and 630b of the first and second insulation layers 610 and 630 when manufacturing a semiconductor package. Meanwhile, the cavities W can alternatively be defined through the first and second insulation layers 610 and 630 after the first and second insulation layers 610 and 630 are separated from each other, as will be described below.

Referring to FIG. 6D, a routing process which cut the outside of the first and second insulation layers 610 and 630 is conducted for the resultant structure having the cavities W defined therein and then, the adhesive 640 is removed such that the structure is divided into the first and second insulation layers 610 and 630 which have the conductive patterns 612 and 632 and the solder masks 650 (which has openings for exposing portions of the conductive patterns 612 and 632) formed on the first surfaces 610a and 630a thereof (ST14). As a consequence, two substrates 600a and 600b for a semiconductor package are simultaneously manufactured.

Thereafter, while not shown in a drawing, as the occasion demands, substrates 600a and 600b manufactured in a strip level are cut into a unit level (ST15).

Figure 1A:
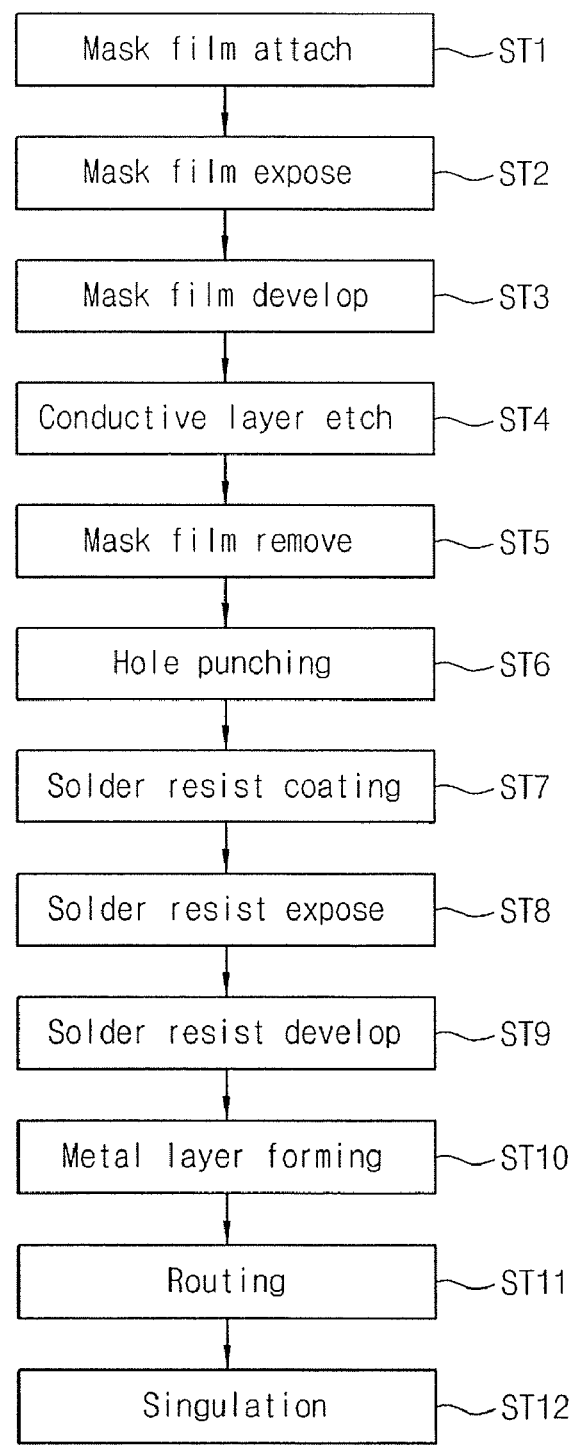
FIGS. 1A and 1B are flow charts explaining conventional methods for manufacturing a substrate for a semiconductor package.

In the present embodiment, two substrates, which are formed with conductive patterns and solder masks on only one of their respective surfaces and are to be used when manufacturing semiconductor packages, are manufactured through a total of 15 steps. Therefore, when compared to the conventional method for manufacturing a substrate for a semiconductor package described in FIG. 1A, in which one substrate for a semiconductor package is manufactured through 12 steps and two substrates are manufactured through 24 steps; in the present embodiment, it is possible to manufacture a substrate for a semiconductor package through a decreased number of processes (that is, two substrates through 15 steps. Thus, in the present embodiment, when compared to the conventional art, productivity can be improved and the manufacturing cost can be reduced.

Also, in the present embodiment, due to the fact that the substrate for a semiconductor package is manufactured to have a structure in which the solder mask is selectively formed on only one surface of an insulation layer, when manufacturing a semiconductor package using the substrate, it is possible to both prevent delamination of an encapsulant during a molding process caused by contamination of the solder mask and to prevent a decrease in reliability resulting from the delamination.

While it was described in the present embodiment that subsequent processes are conducted after the first and second insulation layers, which have the conductive layers formed on the first surfaces thereof, are attached with the second surfaces thereof facing each other; it is conceivable in another embodiment that the first and second insulation layers can be attached with the second surfaces thereof facing each other prior to forming conductive layers, and conductive layers can then be formed on the first surfaces of the first and second insulation layers which are open (i.e. exposed), and a series of subsequent processes can then be conducted.

Of course, even in this case, since two substrates can be simultaneously manufactured by conducting a set of processes, simplification of processes can be accomplished, and cost can be saved.

Figure 9A:
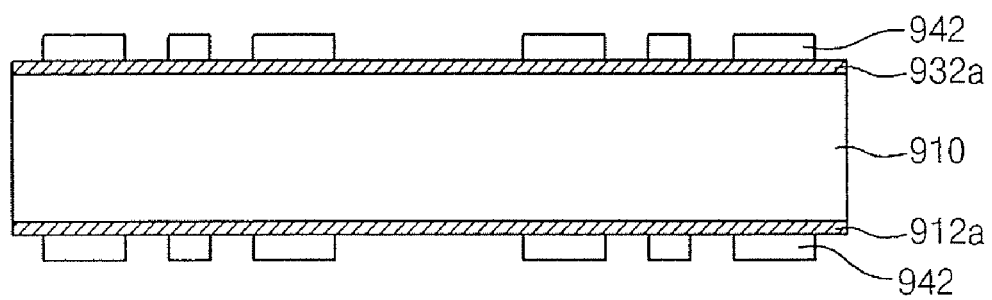
FIGS. 9A through 9D and FIG. 10 are cross-sectional views and a flow chart shown for illustrating and explaining the processes of a method for manufacturing a substrate for a semiconductor package in accordance with a sixth embodiment of the present invention.
Figure 9B:
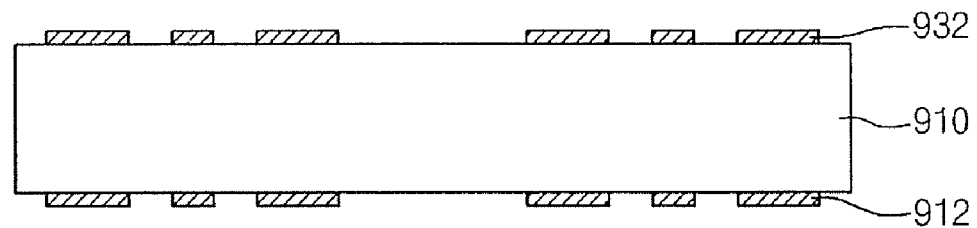
Figure 9C:
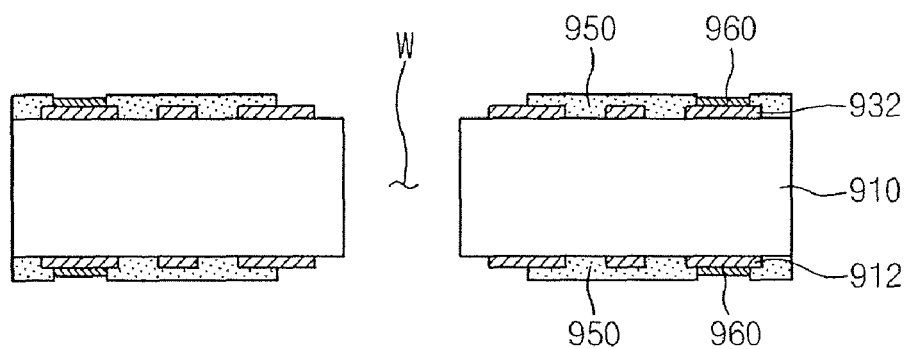
Figure 9D:
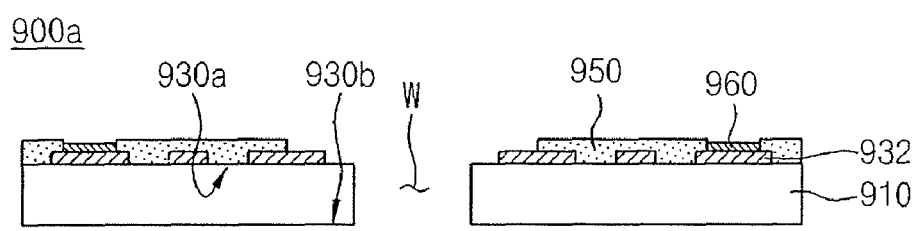
Figure 9D:
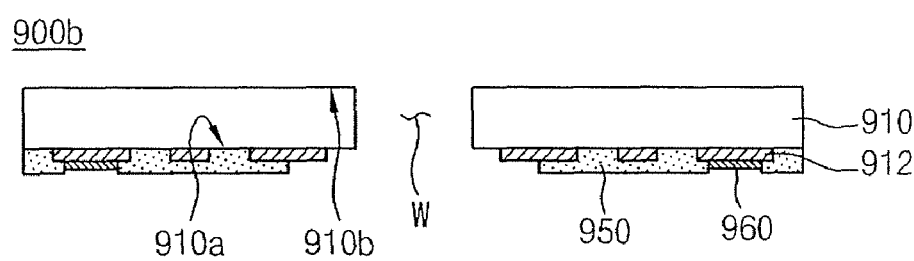
Figure 10:
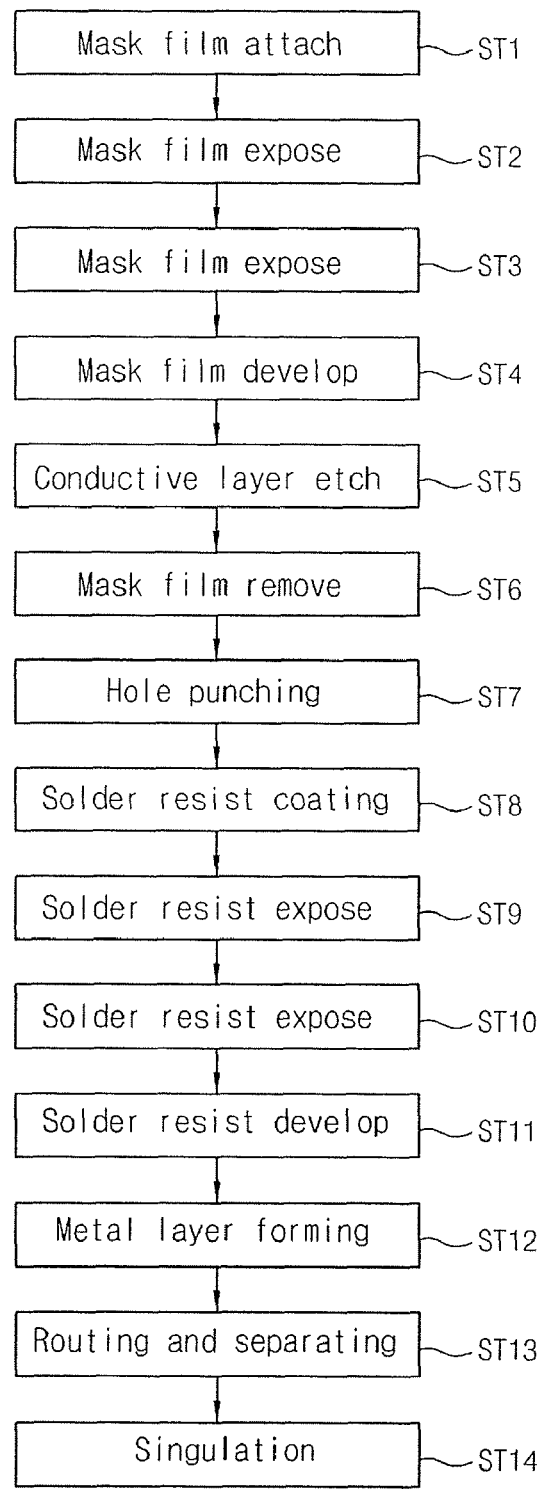

FIGS. 9A through 9D and FIG. 10 are cross-sectional views and a flow chart shown for illustrating and explaining the processes of a method for manufacturing a substrate for a semiconductor package in accordance with a sixth embodiment of the present invention. The method will be described below. FIG. 10 will be referenced while describing FIGS. 9A through 9D.

Referring to FIG. 9A, an insulation layer 910 having a thickness approximately equal to or greater than the summed thickness of two substrates for a semiconductor package is prepared. Conductive layers 912a and 932a are respectively formed on opposing surfaces of the insulation layer 910. Then, mask patterns 942 are formed on the conductive layers 912a and 932a. The mask patterns 942 are formed by attaching mask films (ST1), exposing the mask films formed on both surfaces of the insulation layer 910 (ST2 and ST3), and developing the exposed mask films (ST4) to form the mask patterns 942 having openings that define open portions (i.e. expose the conductive patterns) at predetermined portions of the conductive layers 912a and 932a.

Referring to FIG. 9B, the open portions (i.e., exposed portions) of the conductive layers 912a and 932a are etched using the mask patterns 942 as etch masks (ST5), and through this, conductive patterns 912 and 932 are formed on both surfaces of the insulation layer 910. Then, the mask patterns 942 are removed (ST6).

Referring to FIG. 9C, a hole punching process is conducted (ST7). By applying solder resist to the insulation layer 910 formed with the conductive patterns 912 and 932 on both surfaces thereof (ST8), exposing the applied solder resist (ST9 and ST10) and developing the exposed solder resist (ST11), solder masks 950 are formed on both surfaces of the insulation layer 910 in such a way as to have openings that expose (i.e., leave open) portions of the conductive patterns 912 and 932. Next, metal layers 960 each comprising a stack layer of Ni and Au are formed on the open portions of the conductive patterns 912 and 932 through, for example, a plating process (ST12).

Thereafter, a cavity W is defined through the center portion of the insulation layer 910. Here, since the cavity W is defined through the entire thickness of the insulation layer, which has a thickness corresponding to the summed thickness of two substrates, the single process of defining the cavity W can be conducted for each of the respective insulation layers which are to be obtained by conducting a subsequent process for dividing the insulation layer 910.

Referring to FIG. 9D, a routing process is conducted for the resultant structure, and in succession, the insulation layer 910, which is formed with the conductive patterns 912 and 932 and the solder masks 950 on both surfaces thereof, is cut in the horizontal direction (ST13). Through this, two substrates 900a and 900b for a semiconductor package, each having first surfaces 910a and 930a and second surfaces 910b and 930b facing away from the first surfaces 910a and 930a and each having the conductive patterns 912 and 932 and the solder masks 950 exposing portions of the conductive patterns 912 and 932 selectively formed on only the first surfaces 910a and 930 thereof, are substantially complete in manufacture.

Thereafter, while not shown in a drawing, as the occasion demands, the substrates 900a and 900b manufactured in a strip level are cut into a unit level (ST14).

In the method for manufacturing a substrate for a semiconductor package according to the present embodiment, two substrates for a semiconductor package are manufactured through 14 steps. Therefore, when compared to the conventional method for manufacturing a substrate for a semiconductor package described in FIG. 1A, in which two substrates for a semiconductor package are manufactured through 24 steps; in the present embodiment, it is possible to manufacture a substrate for a semiconductor package through a decreased number of processes (that is, twice the substrates through 14 steps). Thus, in the present embodiment, productivity can be improved and the manufacturing cost can be reduced.

Also, in the present embodiment, due to the fact that the substrate for a semiconductor package is manufactured to have a structure in which the solder mask is selectively formed on only one surface of an insulation layer, when manufacturing a semiconductor package using the substrate, it is possible to both prevent delamination of an encapsulant during a molding process caused by contamination of the solder mask and to prevent a decrease in reliability resulting from the delamination.

Figure 11A:
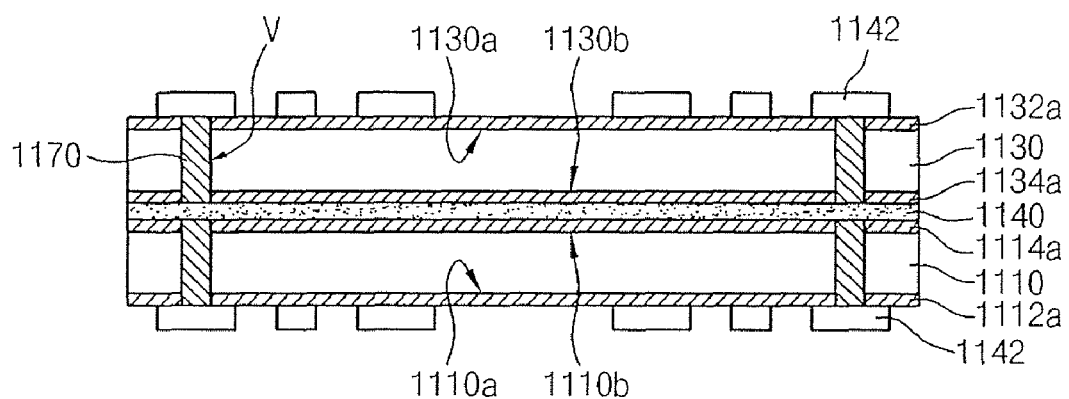
FIGS. 11A through 11D and FIG. 12 are cross-sectional views and a flow chart shown for illustrating and explaining the processes of a method for manufacturing a substrate for a semiconductor package in accordance with a seventh embodiment of the present invention.
Figure 11B:
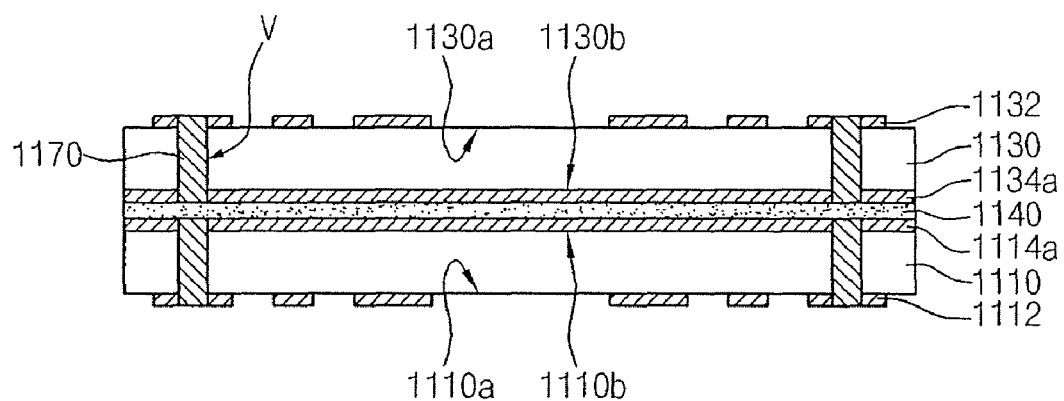
Figure 11C:
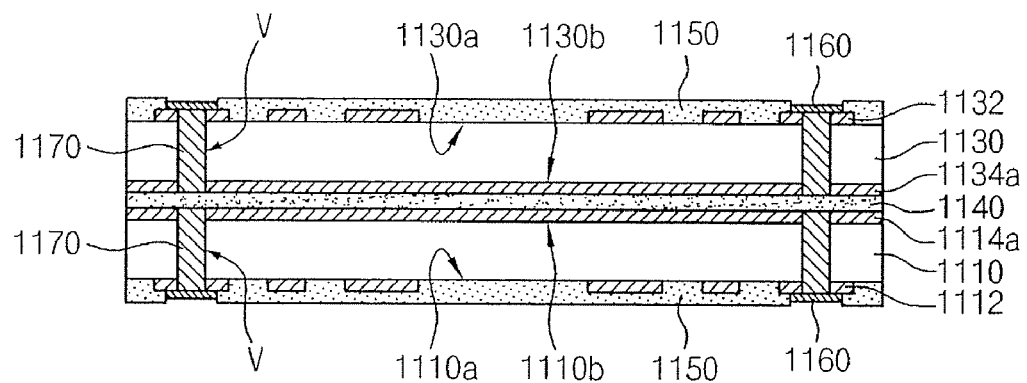
Figure 11D:
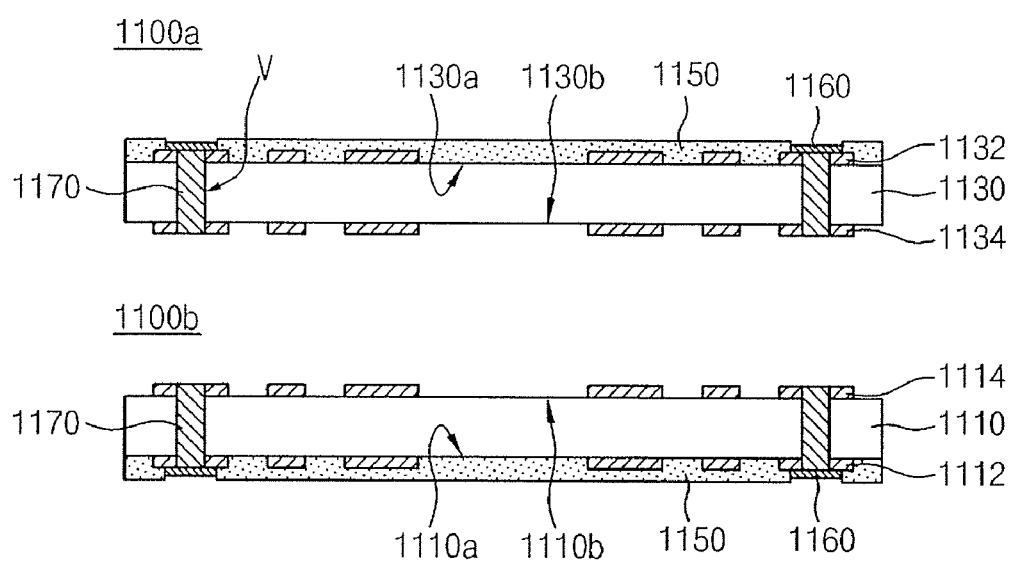
Figure 12:
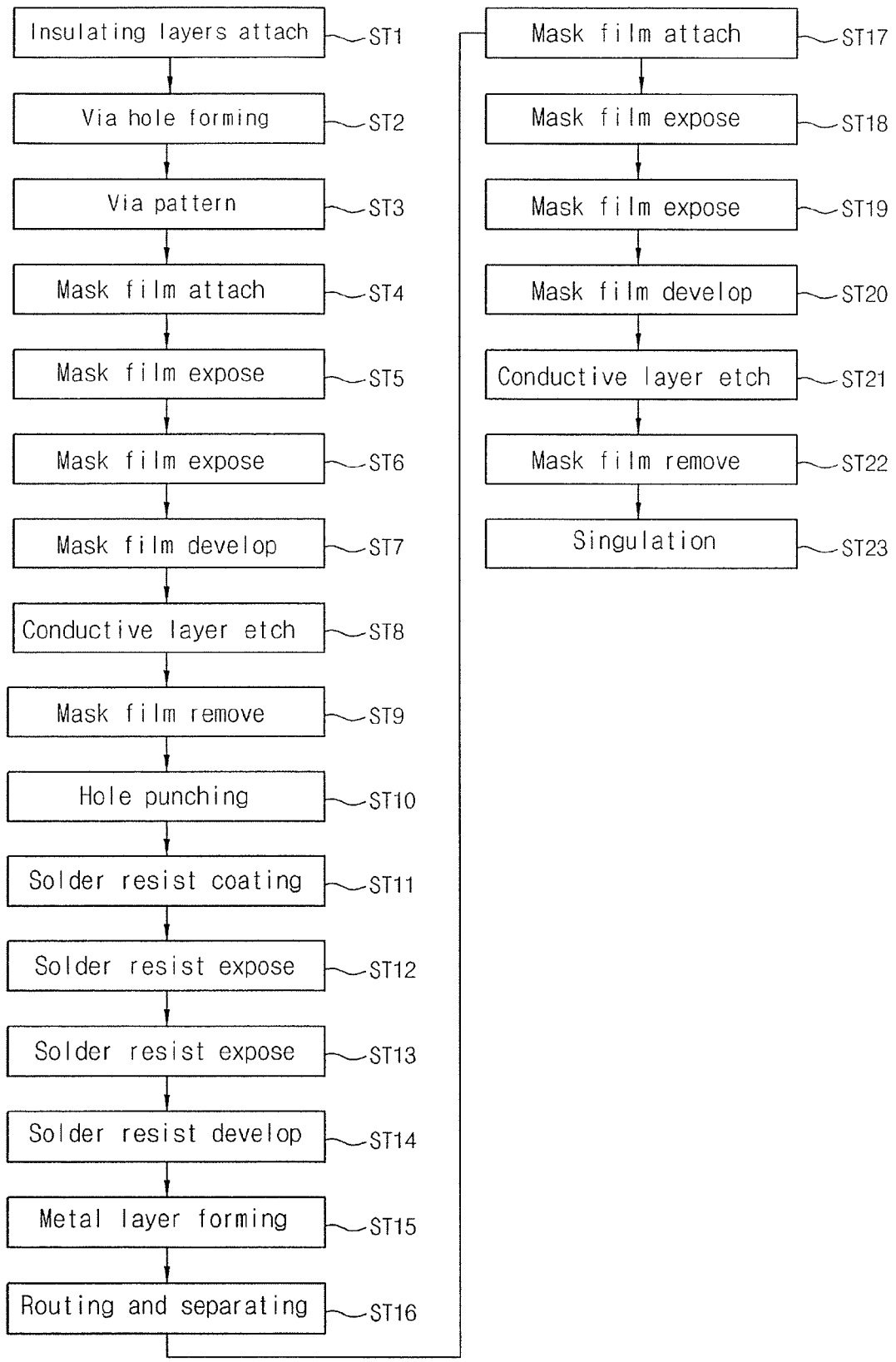

FIGS. 11A through 11D and FIG. 12 are cross-sectional views and a flow chart shown for illustrating and explaining the processes of a method for manufacturing a substrate for a semiconductor package in accordance with a seventh embodiment of the present invention. The method will be described below. FIG. 12 will be referenced while describing FIGS. 11A through 11D.

Referring to FIG. 11A, first and second insulation layers 1110 and 1130 having first surfaces 1110a and 1130a and second surfaces 1110b and 1130b, respectively, are provided. The second surfaces 1110b and 1130b face away from the first surfaces 1110a and 1130a of their respective first and second insulation layers 1110 and 1130. Conductive layers 1112a and 1132a are formed on the first surfaces 1110a and 1130a, respectively; and second conductive layers 1114a and 1134a are formed on the second surfaces 1110b and 1130b, respectively. The first and second insulation layers 1110 and 1130 are attached to each other by the medium of an adhesive 1140 such that the second conductive layers 1114a and 1134a formed on the second surfaces 1110b and 1130b face each other (ST1). The adhesive 1140 is applied to any one of the first insulation layer 1110 and the second insulation layer 1130. In an embodiment, the adhesive 1140 is applied to the peripheral portions of the second surface 1110b of the first insulation layer 1110, as shown in FIG. 8. That is, the insulation layer is formed, for example, on the second surface 1110b and/or 1130b of the first and/or second insulation layer 1110 and/or 1130 at the outermost edge of the second surface 1110b and/or 1130b so as to be formed around the perimeter of the second surface 1110b and/or 1130b and leave exposed a central region of the second surface 1110b and/or 1130b. It is preferred that the adhesive 1140 be applied to portions of the first and/or second insulation layers 1110 and/or 1130 which are to be removed in a subsequent routing process.

Then, a plurality of via holes V are defined through the first and second insulation layers 1110 and 1130 which are attached to each other, through a drilling process (ST2), and via patterns 1170 are formed in the via holes V through a plating process (ST3). Next, mask patterns 1142 are formed by applying mask films to the first conductive layer 1112a of the first insulation layer 1110 and the first conductive layer 1132a of the second insulation layer 1130 including the via patterns 1170 (ST4), exposing the applied mask films (ST5 and ST6), and developing the exposed mask films (ST7) so as to selectively remove portions of the mask film and form the mask patterns 1142 which selectively expose portions of the conductive layers 1112a and 1132a.

Referring to FIG. 11B, portions of the first conductive layers 1112a and 1132a that left open (i.e. exposed) by the mask patterns 1142 are etched using the mask patterns 1142 as etch masks (ST8). Through this, first conductive patterns 1112 and 1132 are selectively formed on the first surfaces 1110a and 1130a of the first and second insulation layers 1110 and 1130, respectively. Next, the mask patterns 1142 used as etch masks are removed (ST9).

Referring to FIG. 11C, a hole punching process is conducted (ST10). Thereupon, solder masks 1150 are formed on the first surfaces 1110a and 1130a of the first and second insulation layers 1110 and 1130 including the first conductive patterns 1112 and 1132 in such a way as to have openings that expose (i.e., leave open) portions of the first conductive patterns 1112 and 1132. The solder masks 1150 with openings for portions of the first conductive patterns 1112 and 1132 are formed by applying solder resist (ST11), exposing the applied solder resist (ST12 and ST13) and developing the exposed solder resist (ST14). Thereafter, metal layers 1160 each comprising a stack layer of Ni and Au are formed on the open portions of the first conductive patterns 1112 and 1132 through a plating process (ST15).

Referring to FIG. 11D, by conducting a routing process and an adhesive removing process for the resultant structure, the first insulation layer 1110 and the second insulation layer 1130 are separated from each other in a state in which the first conductive patterns 1112 and 1132 and the solder masks 1150 opening the portions of the first conductive patterns 1112 and 1132 are formed on the first surfaces 1110a and 1130a, the via patterns 1170 are formed in the first and second insulation layers 1110 and 1130 to be connected to the first conductive patterns 1112 and 1132, and the second conductive layers 1114a and 1134a are formed on the second surfaces 1110b and 1130b (ST16).

Then, mask films are attached to the second conductive layers 1114a and 1134a (ST17), the attached mask films are exposed (ST18 and ST19), the exposed mask films are developed (ST20), and the second conductive layers 1114 and 1134a are etched using the developed mask films as etch masks (ST21). Through this, second conductive patterns 1114 and 1134 are formed on the second surface 1110b of the first insulation layer 1110 and the second surface 1130b of the second insulation layer 1130 to be connected to the via patterns 1170. Next, the mask films used as etch masks are removed (ST22). Through this, the manufacturing process of two substrates 1100a and 1100b for a semiconductor package are substantially complete, and the two substrates 1100a and 1100b are in a state in which the first conductive patterns 1112 and 1132 and the solder masks 1150 having openings for exposing (i.e., leaving open) portions of the first conductive patterns 1112 and 1132 are formed on the first surfaces 1110a and 1130a, the via patterns 1170 are formed in the two substrates 1100a and 1100b to be connected to the first conductive patterns 1112 and 1132, and the second conductive patterns 1114 and 1134 are formed on the second surfaces 1110b and 1130b to be connected to the via patterns 1170.

Thereafter, while not shown in a drawing, as the occasion demands, the substrates 1100a and 1100b manufactured in a strip level are cut into a unit level (ST23).

Figure 1B:
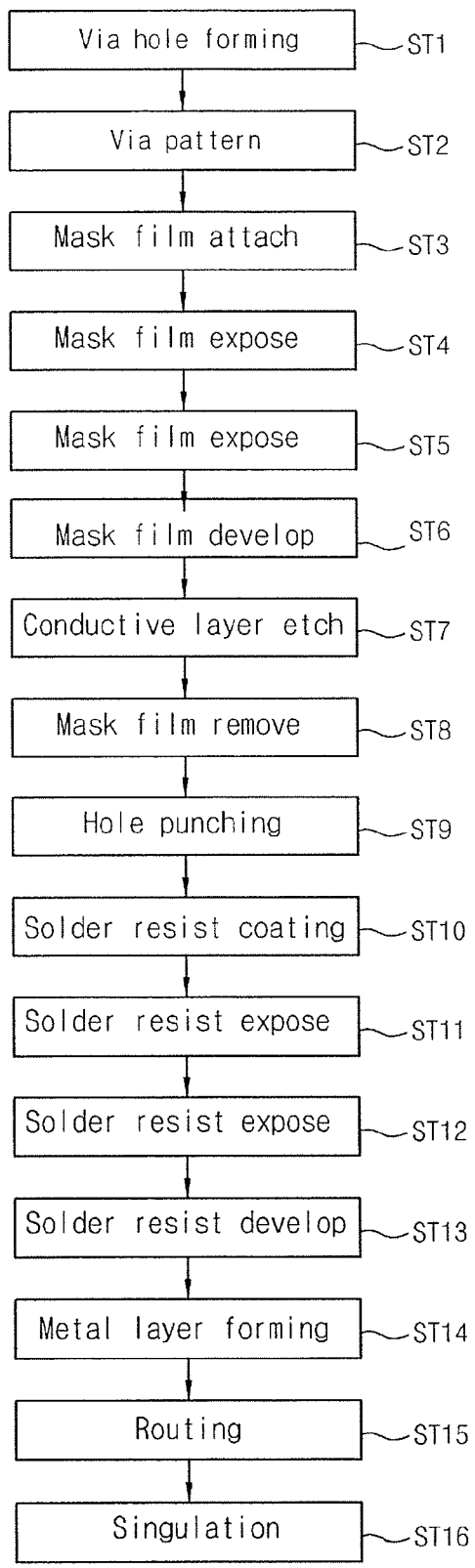

In the present embodiment, two substrates, which are formed with conductive patterns on first and second surfaces thereof and are to be used when manufacturing semiconductor packages, are manufactured through 23 steps. Therefore, when compared to the conventional method for manufacturing a substrate for a semiconductor package described in FIG. 1B, in which one substrate for a semiconductor package is manufactured through 16 steps and two substrates are manufactured through 32 steps; in the present embodiment, it is possible to manufacture a substrate for a semiconductor package through a decreased number of processes (that is, twice the substrates through 23 process steps). Thus, in the present embodiment, productivity can be improved and the manufacturing cost can be reduced. Further, since solder masks are selectively formed on only one surface of the respective insulation layers, when manufacturing a semiconductor package, it is possible to originally prevent an encapsulant from being delaminated due to contamination of the solder mask.

While it was described in the present embodiment that the via patterns are formed after the first and second insulation layers are attached via adhesive to each other, it is conceivable that via patterns can be formed for each of the first and second insulation layers after they are separated from each other. Moreover, second conductive patterns can be formed in a manner such that second conductive layers are formed on the second surfaces of the first and second insulation layers after they are separated from each other (rather than before attachment), and are then patterned.

FIGS. 13A through 13D are cross-sectional views shown for illustrating the processes of a method for manufacturing a substrate for a semiconductor package in accordance with an eighth embodiment of the present invention. The method will be described below.

Figure 13A:
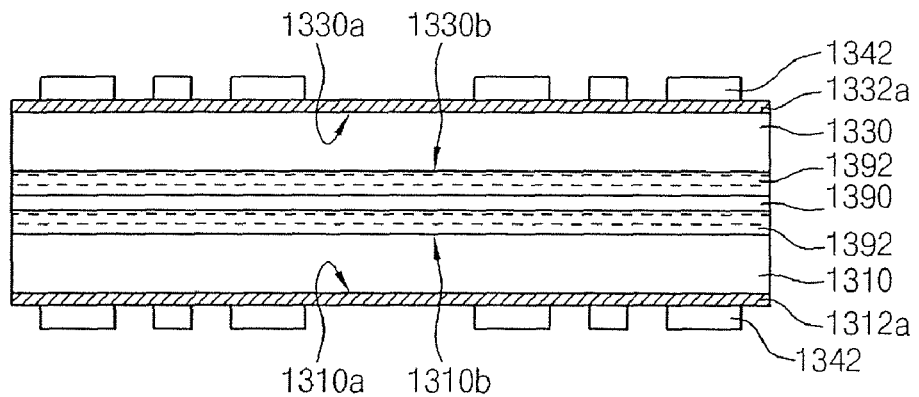
FIGS. 13A through 13D are cross-sectional views shown for illustrating the processes of a method for manufacturing a substrate for a semiconductor package in accordance with an eighth embodiment of the present invention.
Figure 14:
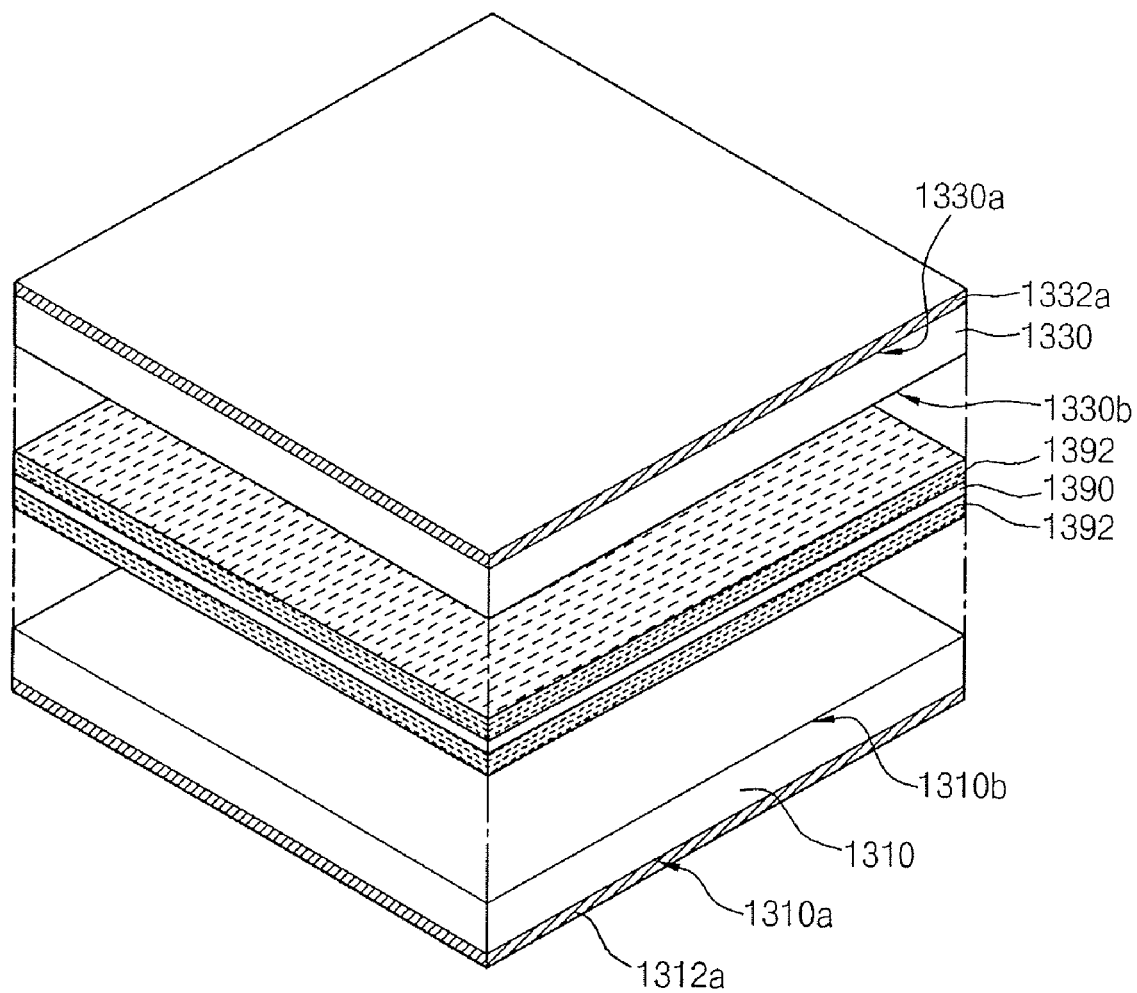
FIG. 14 is an exploded perspective view showing the use of a release film in the method for manufacturing a substrate for a semiconductor package in accordance with the eighth embodiment of the present invention shown in FIGS. 13A-13D.

Referring to FIG. 13A, a first insulation layer 1310 and a second insulation layer 1330 having first surfaces 1310a and 1330a and second surfaces 1310b and 1330b, respectively, are provided. The second surfaces 1310b and 1330b face away from the first surfaces 1310a and 1330a of their respective first and second insulation layers 1310 and 1330. Conductive layers 1312a and 1332a are formed on the first surfaces 1310a and 1330a, respectively. The first insulation layer 1310 and the second insulation layer 1330 are attached to each other such that the second surfaces 1310b and 1330b thereof face each other. The attachment of the first insulation layer 1310 and the second insulation layer 1330 is facilitated by the medium of a release film 1390 having adhesives 1392 attached to both surfaces thereof, as shown in FIG. 14.

Next, mask patterns 1342 are formed on the conductive layers 1312a and 1332a. Similar to the aforementioned embodiments, the mask patterns 1342 are formed by sequentially conducting processes including attaching mask films, exposing the mask films and developing the mask films.

Figure 13B:
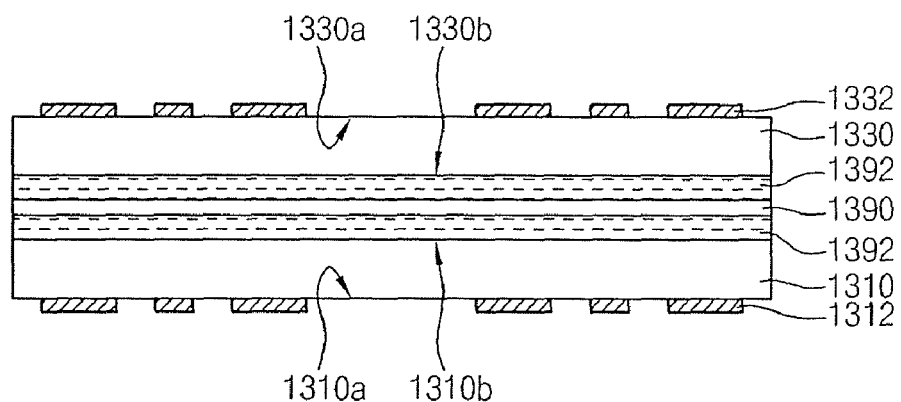

Referring to FIG. 13B, open (i.e., left exposed by the mask patterns 1342) portions of the conductive layers 1312a and 1332a are etched using the mask patterns 1342 as etch masks, and through this, conductive patterns 1312 and 1332 are formed on the first surfaces 1310a and 1330a of the first and second insulation layers 1310 and 1330. Then, the mask patterns 1342 used as etch masks are removed.

Figure 13C:
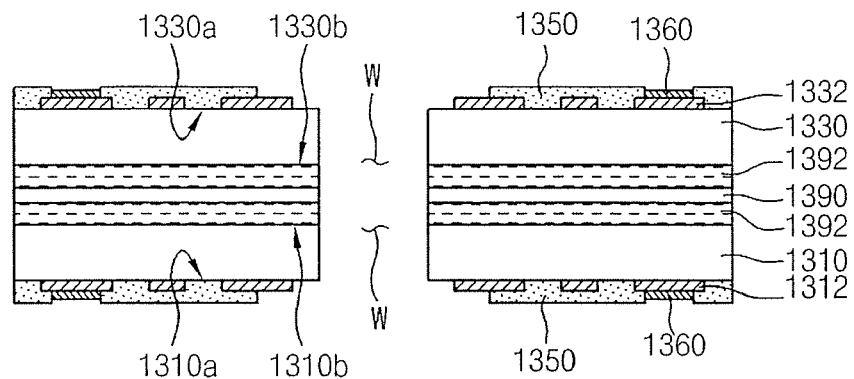

Referring to FIG. 13C, solder masks 1350 are formed on the first surfaces 1310a and 1330a of the first and second insulation layers 1310 and 1330 including the conductive patterns 1312 and 1332 in such a way as to leave open (i.e., leave exposed) portions of the conductive patterns 1312 and 1332. The solder masks 1350 can be understood as being formed by conducting processes including applying solder resist, exposing the applied solder resist and developing the exposed solder resist. Thereupon, metal layers 1360 each comprising a stack layer of Ni and Au are formed on the open portions of the conductive patterns 1312 and 1332 through a plating process. The metal layers 1360 are formed to prevent the portions of the conductive patterns 1312 and 1332 open to external conditions from being corroded and to allow electrical connections to be easily formed between the conductive patterns 1312 and 1332 and metal wires or external connection terminals.

Thereafter, cavities W are defined through the center portions of the first and second insulation layers 1310 and 1330. As shown in FIG. 13C, the cavities W extend through the first and second insulation layers 1310 and 1330 including the release film 1390 having the adhesives 1392 attached to both surfaces thereof. For example, the cavities W can be understood as being defined to allow electrical connections to be easily formed between a semiconductor chip and the conductive patterns 1312 and 1332 in a case in which the semiconductor chip of a center pad type is attached case down (i.e., in a face-down type) to the second surfaces 1310b and 1330b of the first and second insulation layers 1310 and 1330 when manufacturing a semiconductor package. Meanwhile, the cavities W can be alternatively defined through the first and second insulation layers 1310 and 1330 after the first and second insulation layers 1310 and 1330 are separated from each other as will be described below.

Figure 13D:
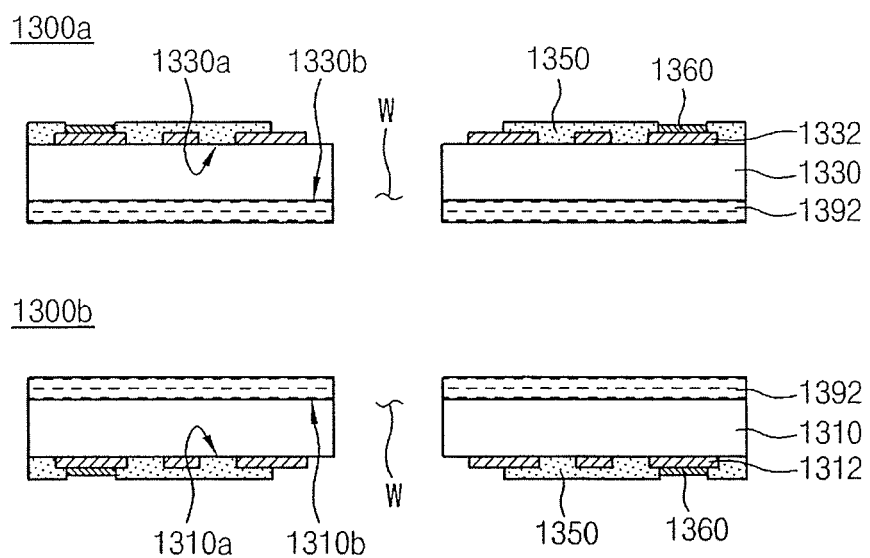

Referring to FIG. 13D, the release film 1390 is removed from the resultant structure having the cavities W defined therein. Through this, two substrates 1300a and 1300b for a semiconductor package are simultaneously manufactured, with each of the two substrates 1300a and 1300b having a structure in which the respective conductive patterns 1312 and 1332 and solder masks 1350 (which has openings leaving exposed, i.e. open, portions of the conductive patterns 1312 and 1332) are formed on the first surfaces 1310a and 1330a of the respective insulation layers 1310 and 1330, and the adhesives 1392 remain attached to the second surfaces 1310b and 1330b of the respective insulation layers 1310 and 1330.

In the method for manufacturing a substrate for a semiconductor package according to the present embodiment, similarly to the aforementioned embodiments, since two substrates are simultaneously manufactured, productivity can be improved and the manufacturing cost can be reduced. Also, because a solder mask is formed on only one surface of a substrate, it is possible to both prevent an encapsulant from being delaminated during a molding process due to contamination of the solder mask and to prevent a decrease in reliability caused by the delamination.

Further, in the method for manufacturing a substrate for a semiconductor package according to the present embodiment, the adhesive which is formed during the process of manufacturing the substrates can now be utilized as an adhesive that is formed in advance on a second surface of an insulation layer, that is, a surface on which a semiconductor chip is to be attached when manufacturing a semiconductor package; and therefore it is not necessary to separately conduct a process for applying an adhesive and processes for semi-curing and completely curing the applied adhesive since the adhesive has already been applied in the method for manufacturing the substrates. As such, productivity can further be improved and the manufacturing cost can further be reduced. In addition, it is also possible to prevent contamination caused due to streaming of an adhesive that occurs during the process for applying an adhesive; and therefore, the quality of a semiconductor package is prevented from deteriorating due to conduction of the process for applying an adhesive in advance.

While it was described in the present embodiment that subsequent processes are conducted after the first and second insulation layers, which have the conductive layers formed on the first surfaces thereof, are attached such that the second surfaces thereof face each other; it is conceivable in another embodiment that the first and second insulation layers can be attached prior to forming conductive layers such that the second surfaces thereof face each other, and conductive layers can then be formed on the open first surfaces of the first and second insulation layers, and a series of subsequent processes can be conducted.

FIGS. 15A through 15D are cross-sectional views shown for illustrating the processes of a method for manufacturing a substrate for a semiconductor package in accordance with a ninth embodiment of the present invention. The method will be described below.

Figure 15A:
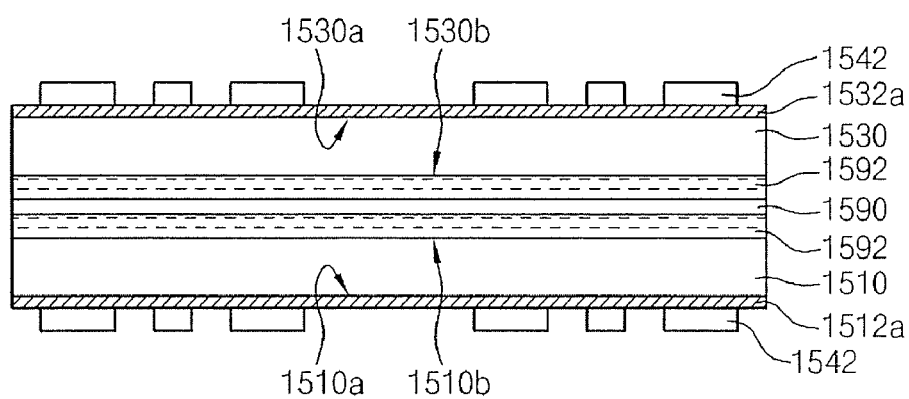
FIGS. 15A through 15D are cross-sectional views shown for illustrating the processes of a method for manufacturing a substrate for a semiconductor package in accordance with a ninth embodiment of the present invention.

Referring to FIG. 15A, a first insulation layer 1510 and a second insulation layer 1530 having first surfaces 1510a and 1530a and second surfaces 1510b and 1530b, respectively, are provided. The second surfaces 1510b and 1530b face away from the first surfaces 1510a and 1530a of their respective first and second insulation layers 1510 and 1530. Conductive layers 1512a and 1532a are formed on the first surfaces 1510a and 1530a, respectively. The first insulation layer 1510 and the second insulation layer 1530 are attached to each other by the medium of a release film 1590, which has adhesives 1592 attached to both surfaces thereof, such that the second surfaces 1510b and 1530b of the first and second insulation layers 1510 and 1530 face each other. Then, mask patterns 1542 are formed on the first conductive layers 1512a and 1532a by sequentially conducting processes including attaching mask films, exposing the mask films and developing the mask films.

Figure 15B:
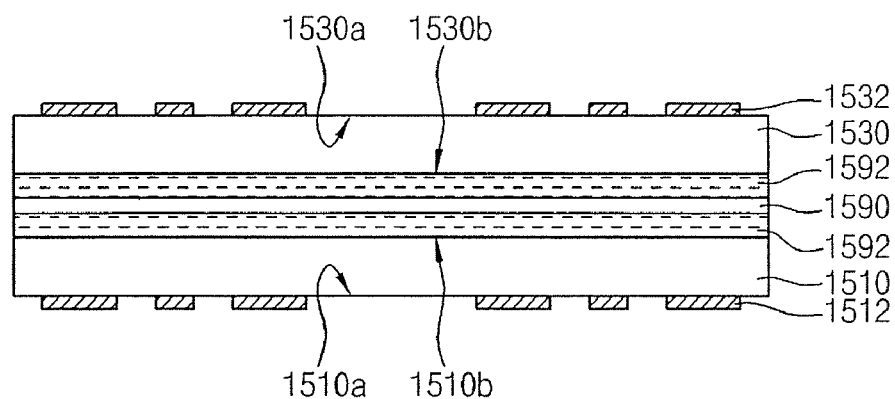

Referring to FIG. 15B, open portions (i.e., portion of the conductive patterns left exposed by the mask pattern 1542) of the first conductive layers 1512a and 1532a are etched using the mask patterns 1542 as etch masks; and through this, first conductive patterns 1512 and 1532 are formed on the first surfaces 1510a and 1530a of the first and second insulation layers 1510 and 1530. Then, the mask patterns 1542 used as etch masks are removed.

Figure 15C:
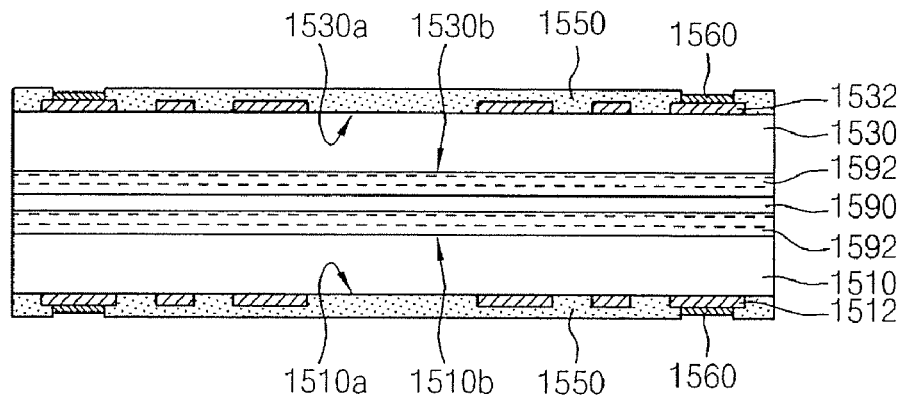

Referring to FIG. 15C, solder masks 1550 are formed on the first surfaces 1510a and 1530a of the first and second insulation layers 1510 and 1530 including the first conductive patterns 1512 and 1532 in such a way as to leave open (i.e., leave exposed) portions of the first conductive patterns 1512 and 1532. The solder masks 1550 can be understood as being formed in the same way as in the aforementioned embodiments. Next, metal layers 1560 each comprising a stack layer of Ni and Au are formed on the open portions of the first conductive patterns 1512 and 1532.

Figure 15D:
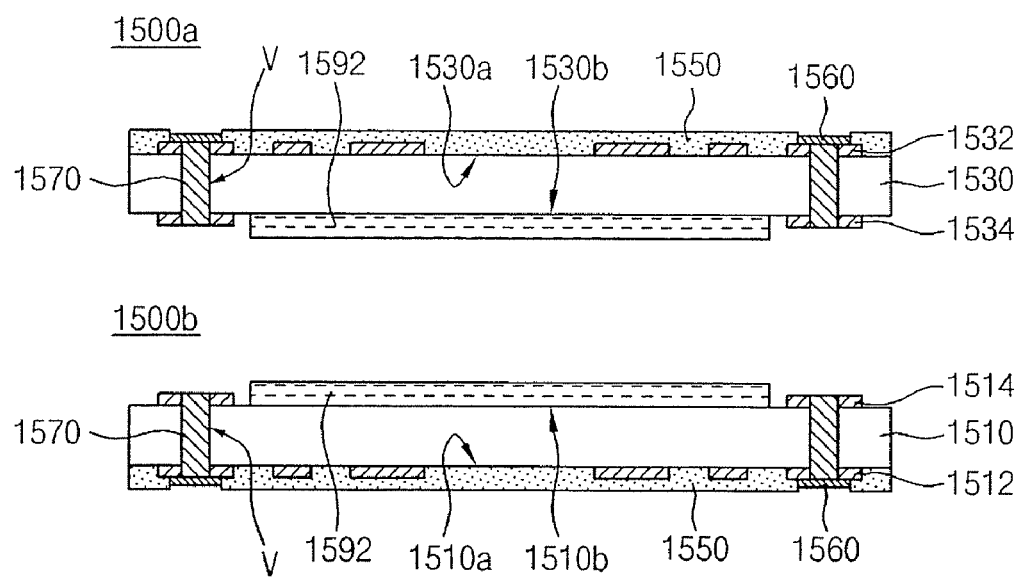

Referring to FIG. 15D, the release film 1590, which is used as an attachment medium between the first and second insulation layers 1510 and 1530, is removed from the resultant structure. Through this, the first and second insulation layers 1510 and 1530 are separated from each other, with the first and second insulation layers 1510 and 1530 having a structure in which the conductive patterns 1512 and 1532 and the solder masks 1550 (which have openings exposing, i.e., leaving open, portions of the conductive patterns 1512 and 1532) are formed on the first surfaces 1510a and 1530a of the respective insulation layers 1510 and 1530, and the adhesives 1592 remain attached to the second surfaces 1510b and 1530b of the respective insulation layers 1510 and 1530.

Via holes V are defined in the separated first insulation layer 1510 and second insulation layer 1530; and thereafter, via patterns 1570 are formed in the via holes V through a plating process. Next, second conductive patterns 1514 and 1534 are formed on the second surfaces 1510b and 1530b of the first and second insulation layers 1510 and 1530 including the via patterns 1570 in such a way as to be connected to the via patterns 1570, as a result of which two substrates 1500a and 1500b for a semiconductor package are manufactured.

The second conductive patterns 1514 and 1534 can be formed, for example, by removing portions of the adhesives 1592 placed around and covering the via patterns 1570 so as to provide an opening over the via patterns 1570 (i.e., removing the adhesive covering the via patterns 1570 and the adhesive on the insulation layer at the peripheral of the via patterns 1570), depositing second conductive layers on the open via patterns 1570 and remaining portions of the adhesives 1592, and then patterning the second conductive layers. The second conductive patterns 1514 and 1534 can be understood as being formed to allow electrical connections to be easily formed between semiconductor chips and the substrates 1500a and 1500b in a case in which the semiconductor chips are attached to the substrates 1500a and 1500b as face-up type or are flip-chip bonded when manufacturing semiconductor packages.

While the via patterns 1570 described with reference to FIG. 15D are formed after the first insulation layer 1510 and the second insulation layer 1530 are separated from each other, it is conceivable in another embodiment that via patterns 1570 can be formed with the first and second insulation layers 1510 and 1530 attached to each other. Further, in the substrate for a semiconductor package in accordance with the present embodiment, it is conceivable that, in a state in which second conductive patterns 1514 and 1534 are formed on the second surfaces 1510b and 1530b of the first and second insulation layers 1510 and 1530, a series of subsequent processes including a process for attaching the first and second insulation layers 1510 and 1530 can be conducted (i.e., the second conductive patterns are formed before attaching the first and second insulation layers 1510 and 1530).

In the method for manufacturing a substrate for a semiconductor package according to the ninth embodiment, similar to the eighth embodiment, productivity can be improved and the manufacturing cost can be reduced. Also, it is possible to both prevent an encapsulant from being delaminated due to contamination of a solder mask and to prevent a decrease in reliability caused by the delamination.

Further, when manufacturing a semiconductor package, it is not necessary to separately conduct a process for applying an adhesive and processes for semi-curing and completely curing the applied adhesive; and therefore, productivity can further be improved and the manufacturing cost can further be reduced. In addition, since it is possible to prevent contamination caused due to streaming of the adhesive, the quality of a semiconductor package is prevented from deteriorating.

Figure 16:
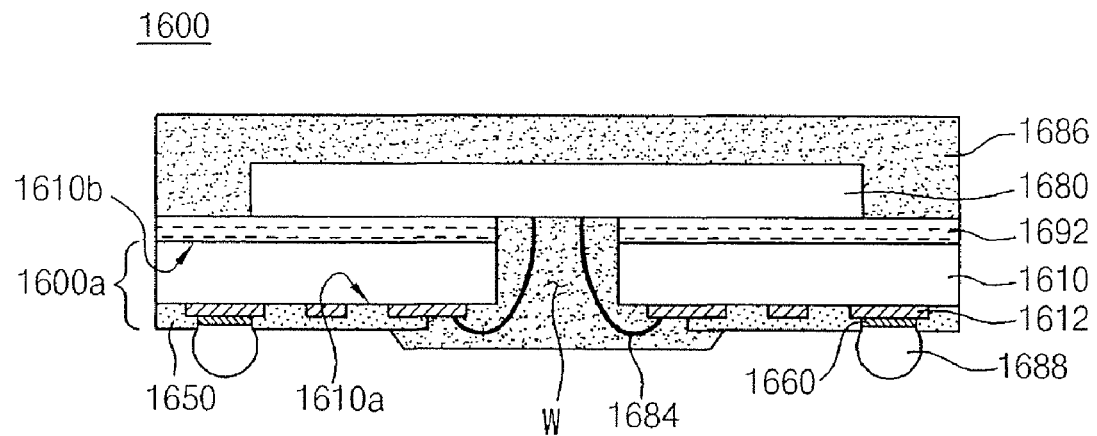
FIG. 16 is a cross-sectional view showing a semiconductor package in accordance with a tenth embodiment of the present invention.

FIG. 16 is a cross-sectional view showing a semiconductor package in accordance with a tenth embodiment of the present invention. The semiconductor package will be described below.

Referring to FIG. 16, a semiconductor package 1600 in accordance with a tenth embodiment of the present invention includes a substrate 1600a having conductive patterns 1612 and a solder mask 1650 formed on a first surface 1610a thereof, an adhesive 1692 attached to a second surface 1610b thereof, and a cavity W defined at the center portion thereof. In detail, the substrate 1600a has a structure in which the conductive patterns 1612 and the solder mask 1650, which has openings for exposing (i.e., leaving open) portions of the conductive patterns 1612, are formed on the first surface 1610a of an insulation layer 1610 (the first surface 1610a facing away from the second surface 1610b), and in which the adhesive 1692 is attached to the second surface 1610b of the insulation layer 1610. A metal layer 1660 comprising a stack layer of Ni and Au is formed on the portions of the conductive patterns 1612 which are open through the solder mask 1650.

A semiconductor chip 1680 of, for example, a center pad type is attached to the second surface 1610b of the substrate 1600a in a face-down type by the medium of the adhesive 1692. The semiconductor chip 1680 and the conductive patterns 1612 of the substrate 1600a are connected to each other by an electrical connection member passing through the cavity W. In an embodiment, metal wires 1684 passing through the cavity W are provided for electrical connection. The second surface 1610b of the substrate 1600a including the semiconductor chip 1680 and the cavity W of the substrate 1600a including the metal wires 1684 are sealed by an encapsulant 1686. External connection terminals 1688 such as solder balls are attached to the metal layer 1660 formed on the conductive patterns 1612, which are formed on the first surface 1610a of the substrate.

Figure 17:
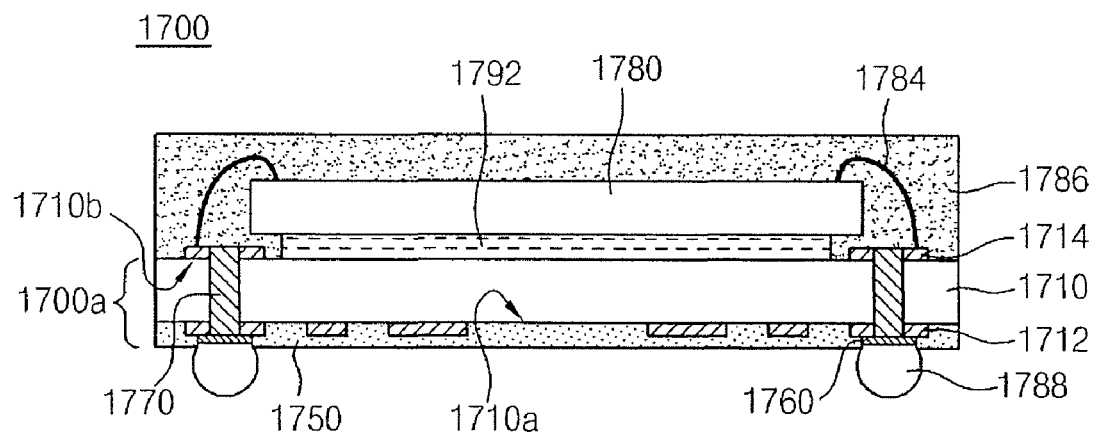
FIG. 17 is a cross-sectional view showing a semiconductor package in accordance with an eleventh embodiment of the present invention.

FIG. 17 is a cross-sectional view showing a semiconductor package in accordance with an eleventh embodiment of the present invention. The semiconductor package will be described below.

Referring to FIG. 17, a semiconductor package 1700 in accordance with an eleventh embodiment of the present invention includes a substrate 1700a having first conductive patterns 1712 and a solder mask 1750 formed on the first surface thereof, an adhesive 1792 attached to the second surface thereof, via patterns 1770 formed within and through the substrate 1700a so as to be connected to the first conductive patterns 1712, and second conductive patterns 1714 formed on the second surface of the substrate 1700a so as to be connected to the via patterns 1770. In detail, the substrate 1700a has a structure in which the first conductive patterns 1712 and the solder mask 1750, which has openings for exposing (i.e., leaving open) portions of the first conductive patterns 1712, are formed on a first surface 1710a of an insulation layer 1710 (the first surface 1710a facing away from the second surface 1710b), a metal layer 1760 comprising a stack layer of Ni and Au is formed on the portions of the first conductive patterns 1712 that are open through the solder mask 1750, and the adhesive 1792 is attached to the second surface 1710b of the insulation layer 1710.

A semiconductor chip 1780 of, for example, an edge pad type is attached to the second surface 1710b of the substrate 1700a in a face-up type by the medium of the adhesive 1792. The semiconductor chip 1780 and the second conductive patterns 1714 of the substrate 1700a are electrically connected to each other by an electrical connection member. In an embodiment, the semiconductor chip 1780 and the second conductive patterns 1714 are connected using metal wires 1784. The second surface 1710b of the substrate 1700a including the semiconductor chip 1780 is sealed by an encapsulant 1786. External connection terminals 1788 such as solder balls are attached to the first conductive patterns 1712 which are formed on the first surface 1710a of the substrate 1700a with the metal layer 1760 formed thereon.

As is apparent from the above description, in the present invention, due to the fact that a solder mask is not formed on a surface of a substrate to which a semiconductor chip is to be attached; contaminants, which are produced in a process of forming a solder mask, do not exist on the surface of the substrate. As a result, adhesion between the substrate and an encapsulant can be increased, whereby it is possible to prevent the encapsulant from being delaminated and the reliability of a semiconductor package can be improved. In addition, because a solder mask is not formed on the surface of the substrate to which a semiconductor chip is to be attached, the overall thickness of the package can be decreased.

Also, in the present invention, since an adhesive for attaching a semiconductor chip is attached in advance to the substrate when manufacturing the substrate, it is not necessary to separately conduct a process for applying an adhesive and processes for semi-curing and completely curing the applied adhesive. Therefore, package manufacturing processes can be simplified, and it is possible to prevent both defects from being caused due to streaming of the adhesive and the reliability of the package from deteriorating.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A substrate for a semiconductor package, comprising:
an insulation layer having a first surface and a second surface facing away from the first surface;
a first conductive pattern formed on the first surface of the insulation layer;
a solder mask formed selectively on the first surface of the insulation layer, the solder mask being formed on the first surface of the insulation layer including the first conductive pattern and having an opening over a portion of the first conductive pattern;

an adhesive applied to the second surface of the insulation layer; and a cavity defined through the insulation layer from the first surface to the second surface at a center portion of the substrate.

2. The substrate according to claim 1, further comprising:

a metal layer plated on the portion of the first conductive pattern which is open through the solder mask.

3. The substrate according to claim 2, wherein the first conductive pattern comprises copper, and the metal layer comprises a stack layer of Ni and Au.

4. The substrate according to claim 1, further comprising:

a via pattern formed in the insulation layer to be electrically connected with the first conductive pattern formed on the first surface of the insulation layer; and a second conductive pattern formed on the second surface of the insulation layer to be electrically connected with the via pattern.

5. A substrate for a semiconductor package, comprising:

an insulation layer having a first surface and a second surface facing away from the first surface;

a first conductive pattern formed on the first surface of the insulation layer, wherein no conductive pattern is formed on the second surface;

a solder mask formed selectively on the first surface of the insulation layer, the solder mask being formed on the first surface of the insulation layer including the first conductive pattern and having an opening over a portion of the first conductive pattern;

an adhesive applied to the second surface of the insulation layer; and a cavity defined through the insulation layer from the first surface to the second surface at a center portion of the substrate, the cavity being defined such that electrical connections are formable between a semiconductor chip of a center pad type and the first conductive pattern.

6. The substrate according to claim 5, further comprising:

a metal layer plated on the portion of the first conductive pattern which is open through the solder mask.

7. The substrate according to claim 5, wherein the first conductive pattern comprises copper, and the metal layer comprises a stack layer of Ni and Au.

* * * * *